United States Patent
Jenny et al.

(10) Patent No.: US 7,505,882 B2
(45) Date of Patent: Mar. 17, 2009

(54) STABLE METHOD AND APPARATUS FOR SOLVING S-SHAPED NON-LINEAR FUNCTIONS UTILIZING MODIFIED NEWTON-RAPHSON ALGORITHMS

(75) Inventors: Patrick Jenny, Zurich (CH); Hamdi A. Tchelepi, San Mateo, CA (US); Seong H. Lee, Emeryville, CA (US)

(73) Assignee: Chevron U.S.A. Inc., San Ramon, CA (US)

( * ) Notice: Subject to any disclaimer, the term of this patent is extended or adjusted under 35 U.S.C. 154(b) by 395 days.

(21) Appl. No.: 11/377,760

(22) Filed: Mar. 15, 2006

(65) Prior Publication Data

US 2006/0265203 A1     Nov. 23, 2006

Related U.S. Application Data

(60) Provisional application No. 60/662,414, filed on Mar. 15, 2005, provisional application No. 60/662,416, filed on Mar. 15, 2005.

(51) Int. Cl.
*G06F 17/10*     (2006.01)
*G06G 7/48*      (2006.01)

(52) U.S. Cl. .................................. 703/2; 703/10; 702/12
(58) Field of Classification Search .................. 703/2, 703/9, 10; 702/11–13

See application file for complete search history.

(56) References Cited

OTHER PUBLICATIONS

Busigin, et al., Efficient Newton-Raphson and Implicit Euler Methods for Solving the HNC Equation, Molecular Physics-An International Journal in the Field of Chemical Physics, May 1992, pp. 89-101, vol. 76, Issue 1, DOI 10.1080/00268979200101181, Taylor & Francis, Philadelphia, Pennsylvania.

Durlofsky, A Triangle Based Mixed Finite Element-Finite Volume Technique for Modeling Two Phase Flow Through Porous Media, Journal of Computational Physics, 1993, pp. 252-266, vol. 105, Elsevier, Inc., Atlanta, Georgia.

(Continued)

*Primary Examiner*—Russell Frejd
(74) *Attorney, Agent, or Firm*—Christopher D. Northcutt; Richard J. Schulte

(57) ABSTRACT

An apparatus and method are provided for solving a non-linear S-shaped function $F=f(S)$ which is representative of a property S in a physical system, such saturation in a reservoir simulation. A Newton iteration (T) is performed on the function $f(S)$ at $S^v$ to determine a next iterative value $S^{v+1}$. It is then determined whether $S^{v+1}$ is located on the opposite side of the inflection point $S^c$ from $S^v$. If $S^{v+1}$ is located on the opposite side of the inflection point from $S^v$, then $S^{v+1}$ is set to $S^l$, a modified new estimate. The modified new estimate, $S^l$, is preferably set to either the inflection point, $S^c$, or to an average value between $S^v$ and $S^{v+1}$, i.e., $S^l=0.5(S^v+S^{v+1})$. The above steps are repeated until $S^{v+1}$ is within the predetermined convergence criteria. Also, solution algorithms are described for two-phase and three-phase flow with gravity and capillary pressure.

14 Claims, 15 Drawing Sheets

OTHER PUBLICATIONS

Fujiwara, et al., The Newton-Raphson Method Accelerated by Using A Line Search-Comparison Between Energy Functional and Residual Minimization, IEEE Transactions on Magnetics, May 2005, pp. 1724-1727, vol. 41, No. 5, DOI 10.1109/TMAG.2005.846048, Institute of Electrical and Electronics Engineers, Inc. (IEEE), Piscataway, New Jersey.

Gang, et al., Multi-Parameter Accelerated Modified Newton-Raphson Methods for Rigid-Plastic FE Analysis, Acta Mechanica Solida Sinica, Dec. 2002, pp. 323-331, vol. 15, No. 4, DOI 10.1007/BF02493033, The Chinese Society of Theoretical and Applied Mechanics, Beijing, China.

Oak, et al., Three-Phase Relative Permeability of Brea Sandstone, Journal of Petroleum Technology (JPT), 1990, pp. 1057-1061, Society of Petroleum Engineers (SPE), Houston, Texas.

Salibian-Barrera, et al., Fast and Stable Bootstrap Methods for Robust Estimates, Computing Science and Statistics, 2002, vol. 34, pp. 346-359, Interface Foundation of North America, Inc., Fairfax Station, Virginia.

Tesch, The Newton-Raphson Method and its Application to Fixed Points, Nov. 21, 2005, Center for Hybrid and Embedded Software Systems at the University of California, Berkeley, Berkeley, California.

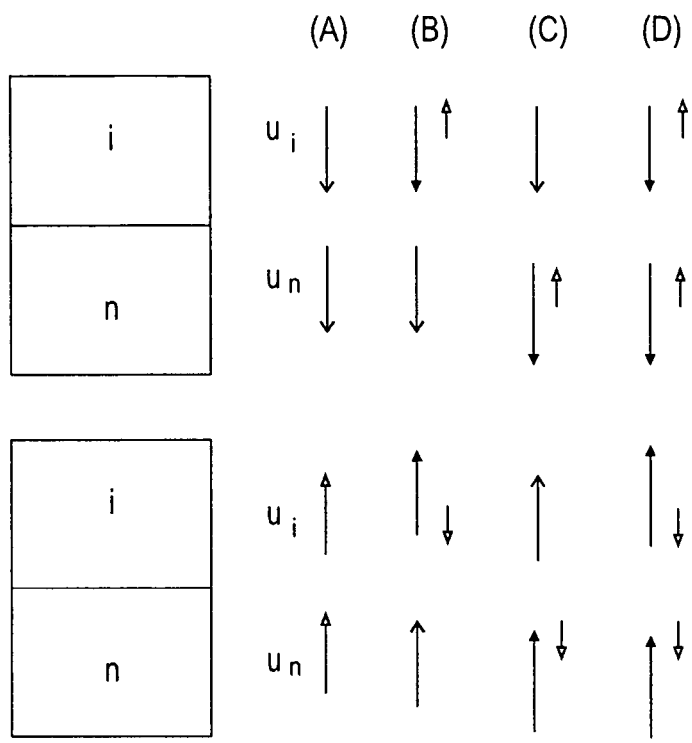
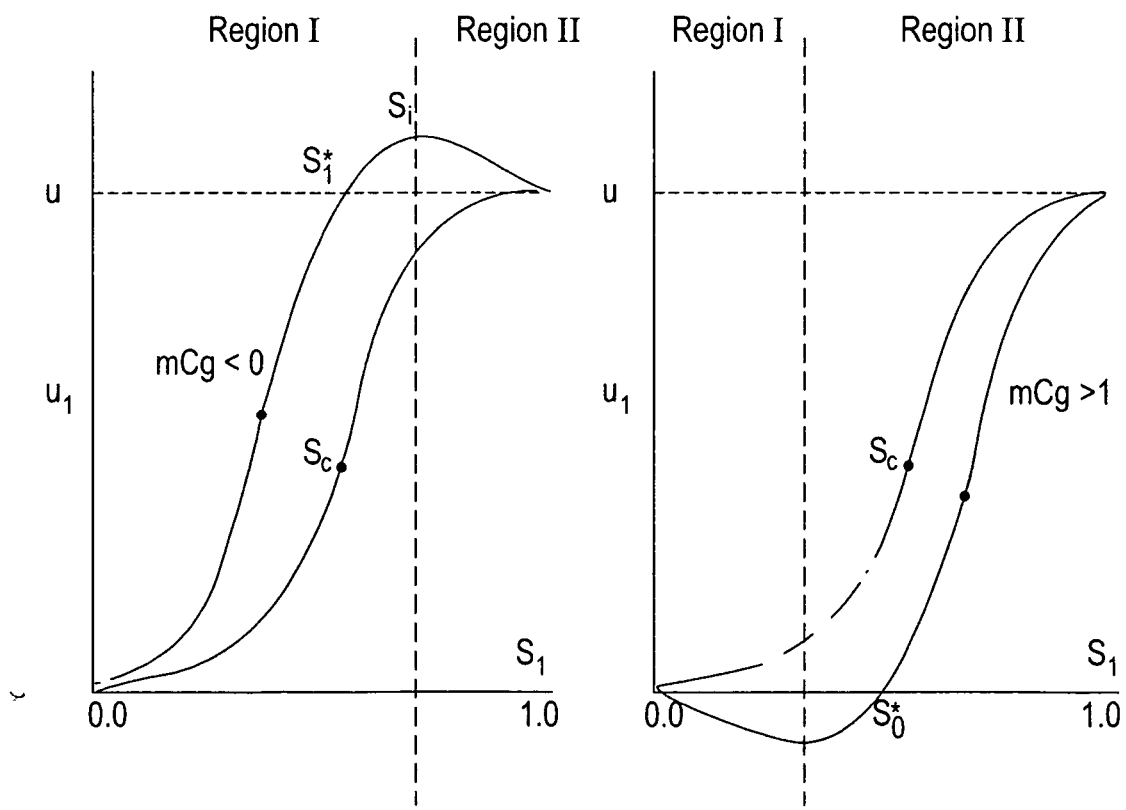
FIG. 18
FIG. 19A    FIG. 19B

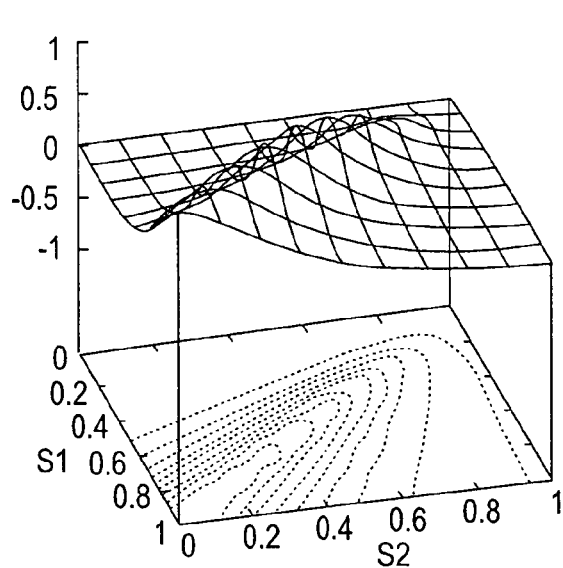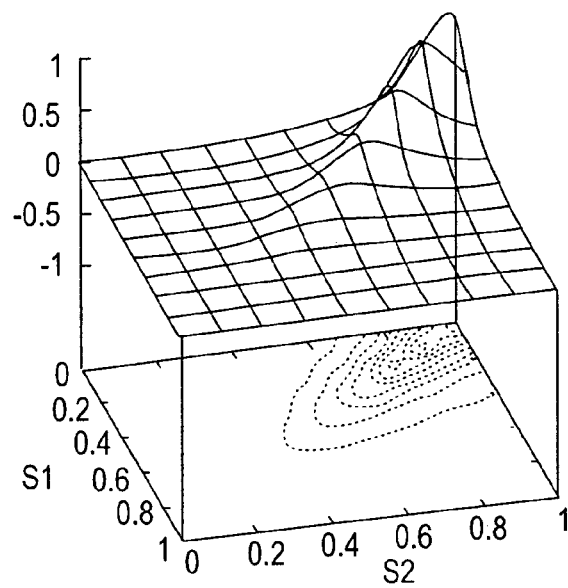
FIG.20A  FIG.20B
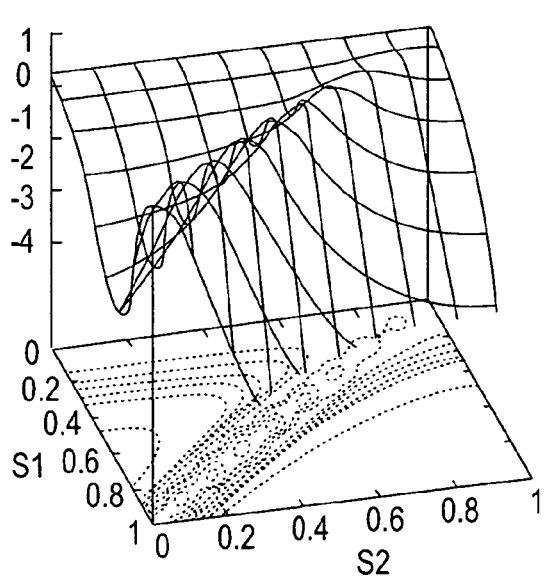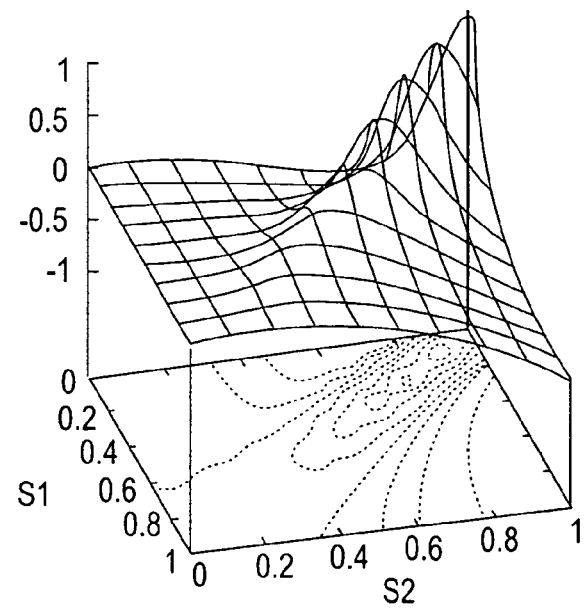
FIG.21A  FIG.21B

STABLE METHOD AND APPARATUS FOR SOLVING S-SHAPED NON-LINEAR FUNCTIONS UTILIZING MODIFIED NEWTON-RAPHSON ALGORITHMS

TECHNICAL FIELD

The present invention relates generally to solution methods employing Newton-Raphson algorithms, and more particularly, to implicit solution algorithms for solving non-linear equations such as S-shaped functions associated with transport problems of reservoir simulators.

BACKGROUND OF THE INVENTION

Implicit solution algorithms are widely used to solve non-linear time dependent transport problems in computational fluid dynamic (CFD) applications such as reservoir simulations. These implicit solution algorithms are commonly used to overcome time step size limitations of explicit methods. Often a solution to these transport problems for a new time level is obtained utilizing the well-known Newton-Raphson method.

FIG. 1 schematically illustrates a simple execution of the Newton-Raphson method for solving, or at least approximating, the solution for a function $F=f(S)$. FIG. 1 depicts a graph of the function:

$$F=f(S). \quad (1)$$

Solving $f(S)=F=0$ determines a root, i.e., where the function $f(S)$ intersects with the horizontal axis, i.e., $F=0$. This intercept location for S is designated with the letter A. If this location, or a satisfactorily close approximation there to, can be determined, then Eqn. (1) is deemed to be solved.

The Newton-Raphson method requires making an initial guess for the solution. The initial guess is labeled as $S^0$ in FIG. 1. A corresponding point B on the curve $F=f(S)$ has the coordinate $(S^0, f(S^0))$. A tangent line is drawn at point B which intercepts with the horizontal axis. The slope of this tangent line is $f'(S^0)$. Algebraically, the equation of the tangent at a general point $S^0$ is:

$$F-f(S^0)=f'(S^0)(S-S^0) \quad (2)$$

The solution S is the horizontal coordinate of the tangent line when $F=0$. Solving for this coordinate:

$$S=S^0-f(S^0)/f'(S^0) \quad (3)$$

This coordinate is then used as a second guess or approximation for the solution of $f(S)=0$ and is designated by $S^1$. Accordingly, $$S^1=S^0-f(S^0)/f'(S^0) \quad (4)$$

A better estimate of the root of Eqn. (1) can be determined by again taking a tangent line at the coordinate $(S^1, f(S^1))$, i.e., point C, and determining its intercept with the horizontal axis. This is accomplished using:

$$S^2=S^1-f(S^1)/f'(S^1) \quad (5)$$

It can be seen that $S^2$ is a better approximation than $S^1$ for the solution of Eqn. (1). An even better estimate is made by taking the tangent to point D, $(S^2, f(S^2))$, which results in the intercept at $S^3$. In general, if an initial approximation or guess for the solution of $F=f(S)$ is $S^n$ the next approximation $S^{n+1}$ may be determined using:

$$S^{n+1}=S^n-f(S^n)/f'(S^n) \quad (6)$$

Eqn. (6) provides the basic formula for the Newton-Raphson method. By repeatedly applying the Newton-Raphson Eqn. (6) to a function $f(S)$, a better and better approximation for the solution to Eqn. (1) can be determined. However, this assumes that application of the Newton-Raphson method to find a solution on $f(S)$ is unconditionally stable. This is not always the case.

In reservoir simulation, the function to be solved is often a transport problem which is linearized around the best estimate of the solution and solved implicitly in each iteration. The transport problem is solved for each cell in a reservoir model in each Newton-Raphson iteration in a typical reservoir simulator. Once a converged solution is obtained after a number of Newton-Raphson iterations for a time step, the simulation then proceeds with the next time step. This approach is straightforward and unconditionally stable, if the flux function is convex (shock) as shown in FIG. 1, concave (rarefaction wave), or linear (contact discontinuity), which is the case for most computational fluid dynamics (CFD) problems. However, for S-shaped flux functions, which are encountered in most oil reservoir simulations, the Newton-Raphson method does not converge if the time steps selected are too large. In reservoir simulation, this problem is usually overcome by empirical time step control techniques. However, often the resulting time step size is conservative or too large, resulting in redundant computation or in time step cuts.

Accordingly, there is a need for an implicit solution algorithm for solving transport problems with S-shaped flux functions which is unconditionally stable, regardless of time step size. The present invention provides a solution to this need.

SUMMARY OF THE INVENTION

A method is provided for solving a non-linear S-shaped function $F=f(S)$ which is representative of a property S in a physical system. The S-shaped function has an inflection point $S^c$ and a predetermined value of F to which $f(S)$ converges. An initial guess $S^v$ is selected as a potential solution to the function $f(S)$. A Newton iteration (T) is performed on the function $f(S)$ at $S^v$ to determine a next iterative value $S^{v+1}$. It is then determined whether $S^{v+1}$ is located on the opposite side of the inflection point $S^c$ from $S^v$. If $S^{v+1}$ is located on the opposite side of the inflection point from $S^v$, then $S^{v+1}$ is set to $S^I$, a modified new estimate. A determination is then made as to whether $S^{v+1}$ is within a predetermined convergence criteria. If not, then $S^v$ is set to $S^{v+1}$ and the above steps are repeated until $S^{v+1}$ is within the predetermined convergence criteria. This converged value of $S^{v+1}$ is then selected as a satisfactory solution S to the S-shaped function $F=f(S)$. The modified new estimate, $S^I$, is preferably set to either the inflection point, $S^c$, or to an average value between $S^v$ and $S^{v+1}$, i.e., $S^I=0.5(S^v+S^{v+1})$. Alternatively, an under-relation factor other than 0.5 may be used, such as a value selected from 0.3 to 0.7.

Also, solution algorithms are described for two-phase and three-phase flow with gravity and capillary pressure.

It is an object of the present invention to provide a method and apparatus utilizing an unconditionally stable modified Newton-Raphson scheme to solve S-shaped non-linear functions to approximate solutions for problems based upon physical systems.

BRIEF DESCRIPTION OF THE DRAWINGS

These and other objects, features and advantages of the present invention will become better understood with regard to the following description, pending claims and accompanying drawings where:

Figure 17A:
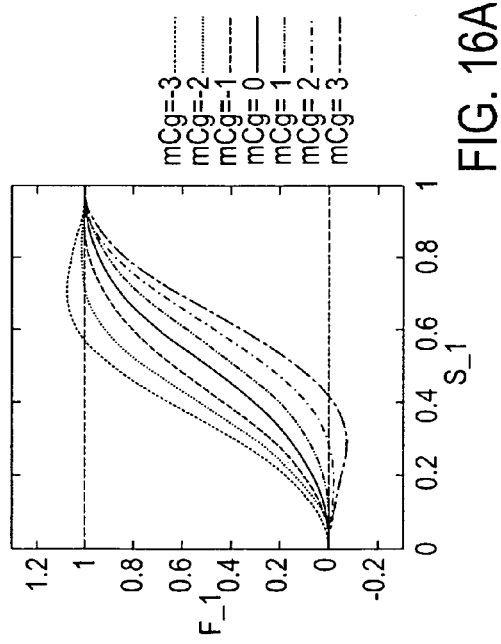
Figure 22A:
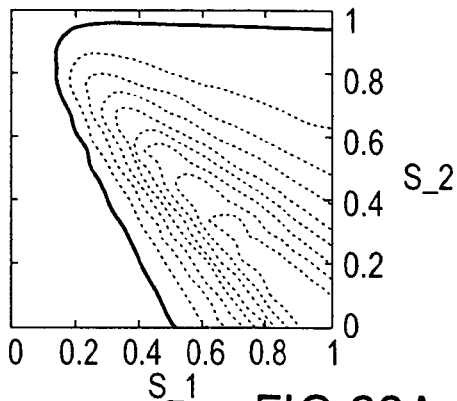
Figure 23A:
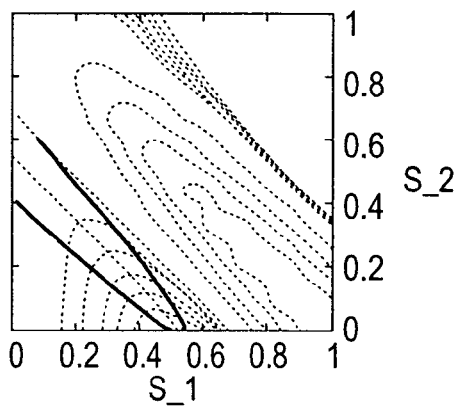
Figure 24A:
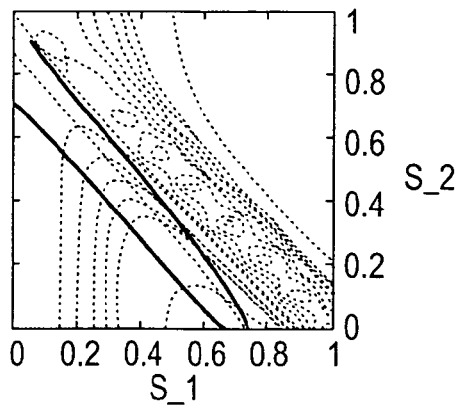

(A) m=1 and (B) m=0.2;

FIGS. 17A and B show fractional flow curves for phase 2: (A) m=1 and (B) m=0.2;

FIG. 18 depicts fractional flow between cells i and n: in the upper figure, cell i is in upwind and in the lower figure cell n is in upwind, (A) no counter-current flow; (B) counter-current flow in cell i (C) counter-current flow in cell n; and (D) counter-current flow in both cells i and n;

FIGS. 19A and B show oil phase (lighter fluid) fractional flow curves with counter-current and co-current flows;

FIGS. 20A and B illustrate fractional flow surfaces with no gravity effect for (A) phase 1 and (B) phase 2: $m_1=0.2$, $m_3=10$, and $C_{g1}=C_{g2}=0$;

FIGS. 21A and B show fractional flow surfaces with gravity effect for (A) phase 1 and (B) phase 2: $m_1=0.2$, $m_3=10$; $C_{g1}=5$, $C_{g2}=10$;

FIGS. 22A and B depict fractional flow surfaces with no gravity effects (A) phase 1 and (B) phase 2: $m_1=0.2$, $m_3=10$. $C_{g1}=0$, $C_{g2}=0$;

FIGS. 23A and B depict fractional flow surfaces with small gravity effects (A) phase 1 and (B) phase 2: $m_1=0.2$, $m_3=10$. $C_{g1}=0.5$ and $C_{g2}=1.0$;

FIGS. 24A and B depict fractional flow surfaces with large gravity effects (A) phase 1 and (B) phase 2: $m_1=0.2$, $m_3=10$. $C_{g1}=5$ and $C_{g2}=10$;

DETAILED DESCRIPTION OF THE INVENTION

I. Theoretical Background and Numerical Studies for Reservoir Simulation

Consider the following hyperbolic equation:

$$\frac{\partial S}{\partial t} + \nabla \cdot (fu) = 0 \text{ on } \Omega \quad (7)$$

Eqn. (7) is a model equation which represents the transport of one phase in a two phase subsurface flow problem. The dependent variable S is the saturation of that phase ($0 \leq S \leq 1$), $f$ is a function of S with $0 \leq f \leq 1$, and u is a divergence free total velocity field. For simplicity, but without loss of generality, u is considered constant, and it is assumed that $\partial f/\partial S \geq 0$.

Figure 1:
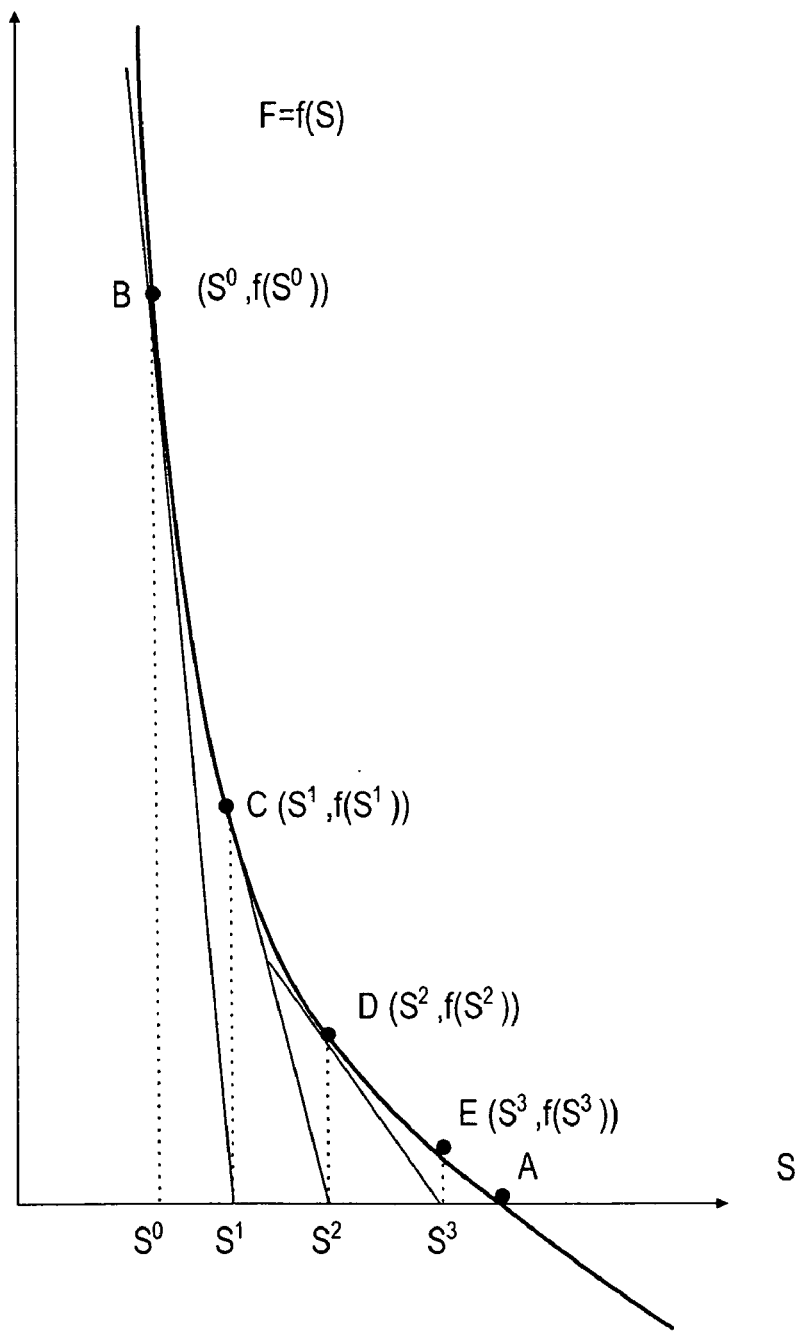
FIG. 1 graphically illustrates the iterative solution of a function F=f (S) using a conventional Newton-Raphson method.
Figure 2:
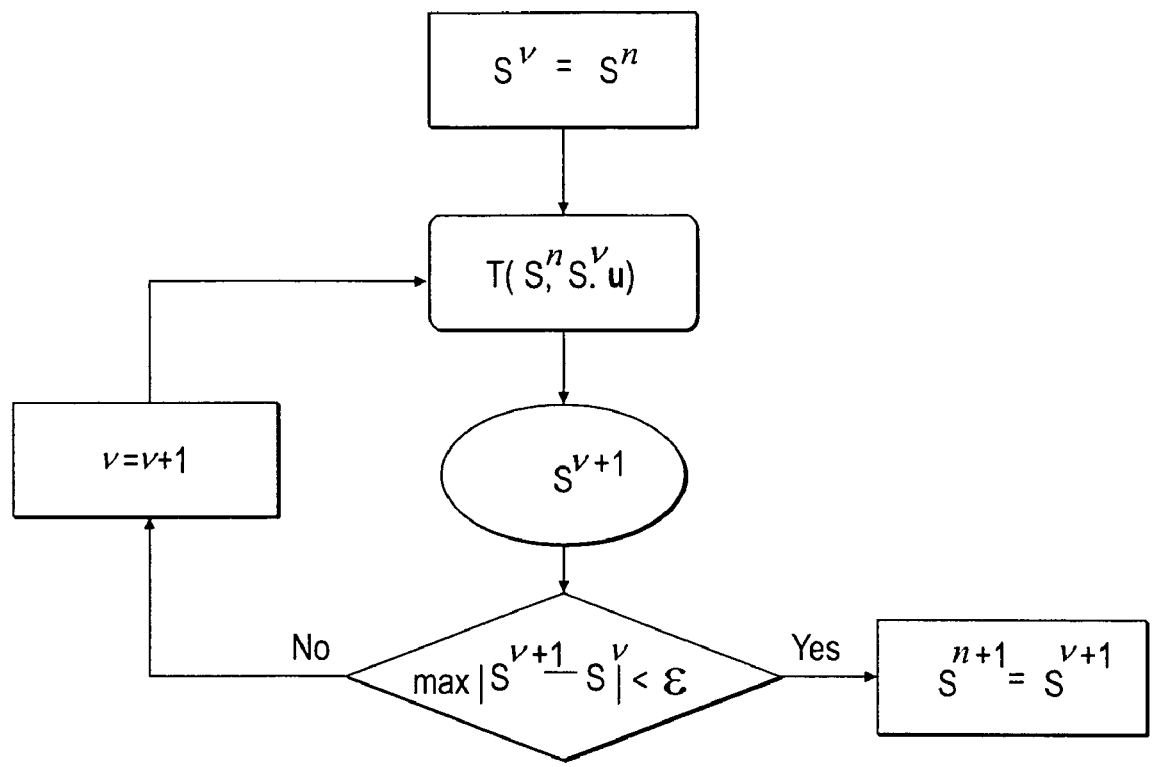
FIG. 2 is a flow diagram for one time step in a conventional reservoir simulator wherein the operator T represents solving a linearized transport equation using a Newton iteration.

The nonlinear transport problem of Eqn. (7) may be solved iteratively using a conventional Newton-Raphson method as outlined in the flow diagram of FIG. 2. This procedure results in the solution $S^{n+1}$ at a new time level. An initial guess $S^\nu$ for the solution to an S-shaped function is made. This guess may be the saturation value $S^n$ from the previous time step. In each iteration ν, the linearized transport equation is preferably solved for each cell in a reservoir model or submodel (represented by the operator T) which results in an updated saturation field $S^{\nu+1}$. Once the maximum absolute saturation change from one iteration to the next does not exceed an appropriately defined threshold ε, this nonlinear loop is considered converged and $S^{\nu+1}$ constitutes the solution $S^{n+1}$ at the new time level.

A 2D discretization of Eqn. (7) is studied:

$$S_{i,j}^{\nu+1} - S_{i,j}^n + u_x \underbrace{\frac{\Delta t}{\Delta x}}_{c_x} \left( f_{i,j}^{n+1} - f_{i-1,j}^{n+1} \right) + u_y \underbrace{\frac{\Delta t}{\Delta y}}_{c_y} \left( f_{i,j}^{n+1} - f_{i,j-1}^{n+1} \right) = 0 \quad (8)$$

which is based on implicit Euler and first order upwinding. For simplicity, Eqn. (8) is written for the case in which both components of the velocity vector $u=\{u_x, u_y\}^T$ are greater than or equal to zero and an orthogonal, uniformly spaced grid is assumed. Each grid cell can be identified by an index pair i, j and the grid spacing in the two coordinate directions is defined by Δx and Δy. The superscripts n and ν denote the old time and iteration levels, respectively, and Δt is time step size. In order to solve Eqn. (8), the flux $f^{n+1}$ in Eqn. (8) is approximated by the linearization $$f^{n+1} \approx f^{\nu+1} = f^\nu + \underbrace{\left(\frac{\partial f}{\partial S}\right)^\nu (S^{\nu+1} - S^\nu)}_{f'^\nu} \quad (9)$$

Finally, an approximation $S^{\nu+1}$ of $S^{n+1}$ is obtained by solving the linearized system:

$$S_{i,j}^{\nu+1} + c_x(f'_{i,j}{}^\nu S_{i,j}^{\nu+1} - f'_{i-1,j}{}^\nu S_{i-1,j}^{\nu+1}) + c_y(f'_{i,j}{}^\nu S_{i,j}^{\nu+1} - f'_{i,j-1}{}^\nu S_{i,j-1}^{\nu+1}) = S_{i,j}^n - c_x(f_{i,j}^\nu - f_{i-1,j}^\nu) - c_y(f_{i,j}^\nu - f_{i,j-1}^\nu) + c_x(f'_{i,j}{}^\nu S_{i,j}^\nu - f'_{i-1,j}{}^\nu S_{i-1,j}^\nu) + c_y(f'_{i,j}{}^\nu S_{i,j}^\nu - f'_{i,j-1}{}^\nu S_{i,j-1}^\nu) \quad (10)$$

which is obtained by substituting Eqn. (9) into Eqn. (8). It is important to enforce $0 \leq S^{\nu+1} \leq 1$ every time Eqn. (10) is solved.

Figure 3:
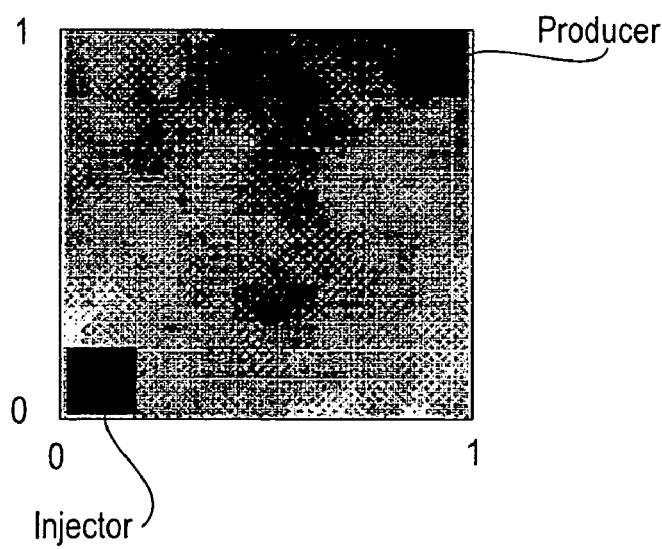
FIG. 3 shows a permeability field k of a 30×30 grid for a 2D test case which includes the locations of injector and producer wells.
Figure 4A:
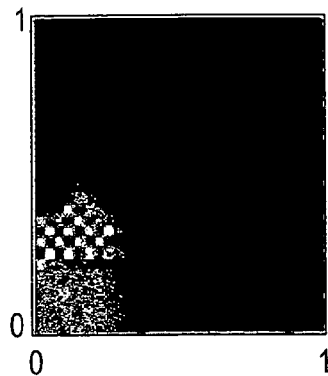
FIGS. 4A, 4B, and 4C show the saturation distributions of the permeability field k from FIG. 3 after a few initial time steps.
Figure 4B:
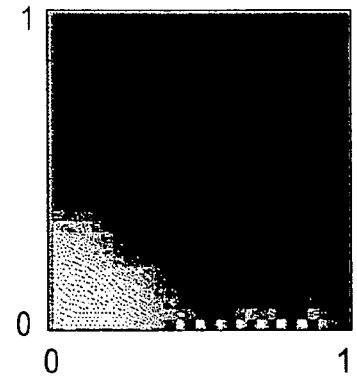
Figure 4C:
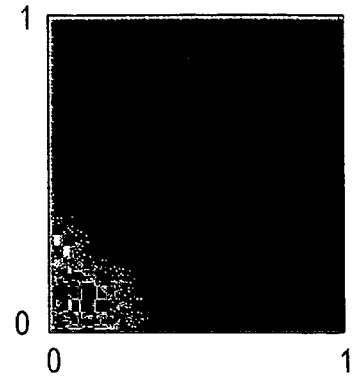

For numerical studies presented in this specification, a 30×30 grid of cells is used for modeling. FIG. 3 shows a permeability field k and injector and producer well locations employed to compute the total velocity $u = -\lambda \Delta p$ by solving the elliptic equation:

$$\nabla \cdot (\lambda \nabla p) = -q \text{ on } \Omega \quad (11)$$

for the pressure p. Here, $\lambda$ is the total mobility $$\lambda = \left( \frac{k_{r1}}{\mu_1} + \frac{k_{r2}}{\mu_2} \right)$$

where $k_{rj}$ is the relative permeability of phase j and $\mu_j$ is the viscosity of the phase. The source term q is 1 at the producer well and −1 at the injector well and S≡0 is the initial condition for the saturation. For the case of a simple quadratic function, an exemplary S-shaped fractional flow function can be represented by $$f(S) = \frac{\frac{S^2}{\mu_1}}{\frac{S^2}{\mu_1} + \frac{(1-S)^2}{\mu_2}} \quad (12)$$

where $\mu_1$ and $\mu_2$ are the viscosities of the two phases (the injected phase is labeled with the subscript 1). In order to demonstrate that the implicit solution algorithm explained above, with respect to FIG. 2, is unstable for time steps which are too large, results are presented for three numerical experiments for which $\mu_1/\mu_2$ is chosen to be 1, 10, and 0.1, respectively. FIG. 4 shows the saturation distributions after a few initial time steps. Although the time steps are relatively small in terms of pore volume injected (PVI), the results show strong oscillatory behavior characterized by the checkerboard-like pattern of the saturation front. The nonlinear loop of the solution algorithm of FIG. 2 does not converge and the number of iterations is limited to 200. The origin of this instability, or oscillatory behavior, will now be investigated and a modification will be described which results in an unconditionally stable scheme for use of the Newton-Raphson method.

A key to understanding the stability issues of nonlinear transport problems lies in the linearization of Eqn. (9) of the flux function. First, the nonlinearity of the transport problem $f(S)$ is isolated. Second, a determination is made of those starting values, in the range $0 \leq S^0 \leq 1$, for which an iterative scheme fulfills the convergence conditions:

$$\lim_{\nu \to \infty} f(S^\nu) = F, \quad (13)$$

-continued $$f(S^\nu) + f'(S^\nu)(S^{\nu+1} - S^\nu) = F. \quad (14)$$

of $f(S)$ around $S^\nu$. The Newton iteration equation is obtained as follows:

$$S^{\nu+1} = S^\nu + \frac{F - f(S^\nu)}{f'(S^\nu)}. \quad (15)$$

In addition, $0 \leq S \leq 1$ is enforced after each iteration. Now the combinations of $S^0$ and F for which condition (13) is met will be investigated. The condition (13) is always met if the function f is a linear, convex, or concave function of S. Since the linear case is trivial, only examples for the convex and concave cases will be shown which are, respectively, represented by $f(S)=S^2$ and $f(S)=1-(1-S)^2$.

Figure 5A:
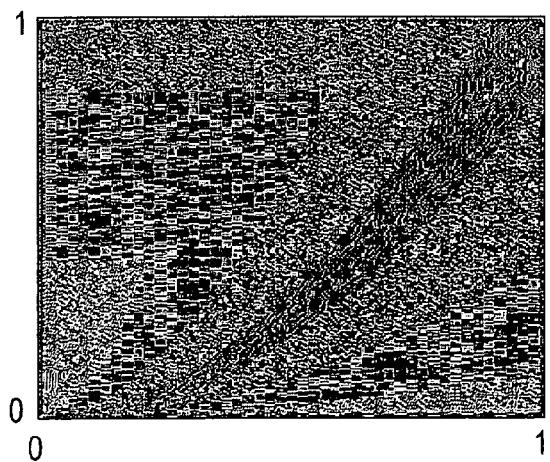
FIGS. 5A and 5B illustrate convergence maps of respective convex and concave functions $f$S)
Figure 5B:
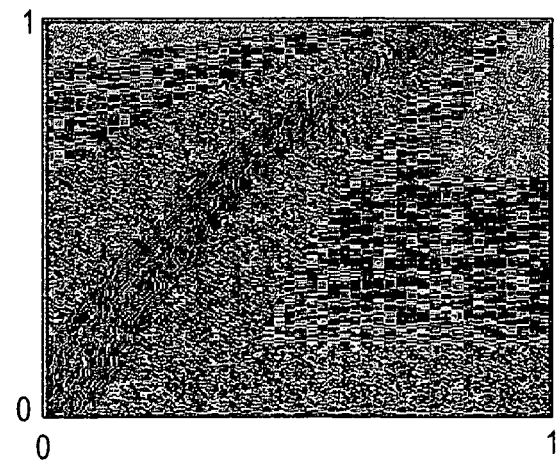

FIGS. 5A and 5B show convergence maps of these convex and concave functions. The convergence maps are created by selecting an initial value of $S^0$ and a target value F for the flux function f. Then the number of iterations is determined which are required to converge within a predetermined tolerance to target value F. The horizontal axis represents the start value $S^0$ and the vertical axis the target value F. This process is repeated for a large number of start values $0 \leq S^0 \leq 1$ at target value F. The process is then repeated for a number of target values of $0 \leq F \leq 1$. This determination of the number of iterations required to achieve convergence for each value (S, F) is then plotted to produce a convergence map.

Fast convergence is represented by darker shades and white color shows the regions in the parameter space for which the iteration Eqn. (15) does not converge. There is no white region present in FIGS. 5A and 5B and therefore the iteration scheme is unconditionally stable for convex and concave functions $f(S)$.

Figure 6A:
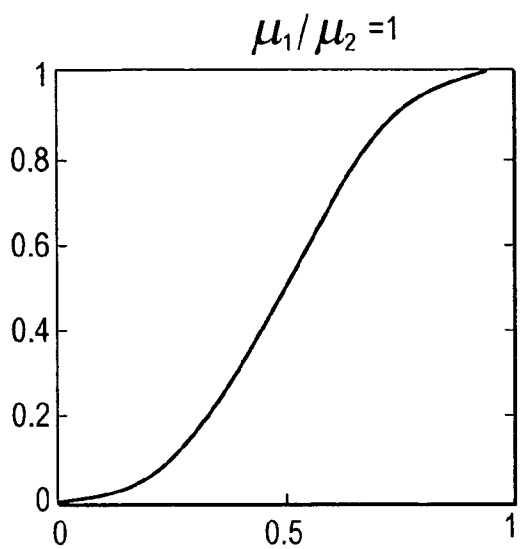
FIGS. 6A and 6B depict S-shaped flux functions and FIGS. 6C and 6D illustrate corresponding convergence maps made utilizing a conventional Newton-Raphson scheme.
Figure 6B:
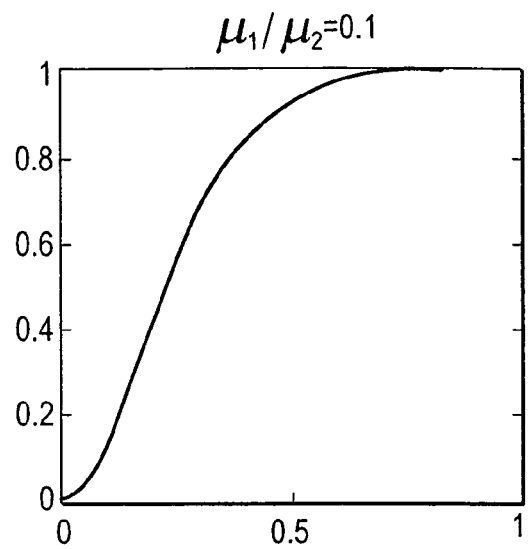

The situation is different, however, if the flux function $f$ is an S-shaped function. An S-shaped function is characterized by having a convex portion and a concave portion which are joined at an inflection point $S^c$ as seen in FIGS. 6A and 6B. The inflection point $S^c$ is characterized as being the point about which the second derivatives of the function $f(S)$, f"(S), changes sign.

Figure 6C:
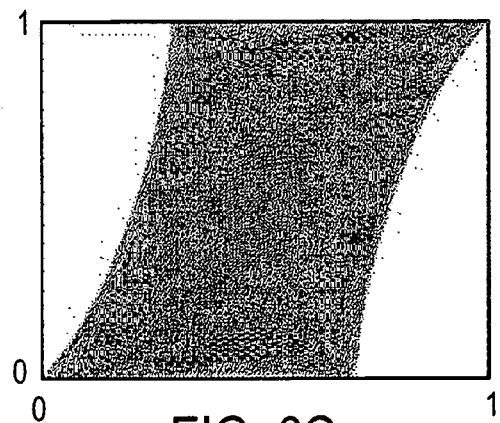
Figure 6D:

The upper plots in FIGS. 6A and 6B show $f$ defined by Eqn. (12) for $\mu_1/\mu_2=1$ and $\mu_1/\mu_2=0.1$, respectively. The corresponding convergence maps are shown in FIGS. 6C and 6D. The existence of large, white regions clearly shows that the iteration scheme applied to the flux function $f$ of Eqn. (12) is not unconditionally stable for these values of $\mu_1/\mu_2$. Convergence can be achieved if the initial guess for $S^0$ is close to the final solution, i.e., if $|f(S^0)-F|$ is not too large. This is consistent with limiting the time step size or the maximum saturation change, if a transport problem is solved.

Convergence maps in FIGS. 6C and 6D show that the iteration Eqn. (15) converges for all possible target values F, if $S^0=S^c$, where $S^c$ is the inflection point of $f$. This finding suggests setting $S^{\nu+1}=S^c$, if the second derivatives of $f(S^\nu)$ and $f(S^{\nu+1})$ have opposite signs. If this is done at the end of each Newton iteration, a modified Newton-Raphson scheme is produced which is unconditionally stable for S-shaped flux functions.

Figure 7A:
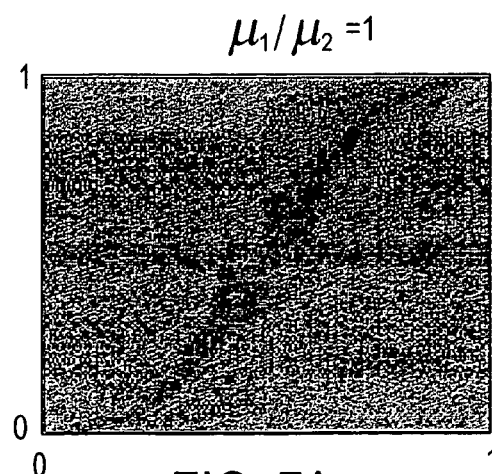
FIGS. 7A and 7B illustrate convergence maps obtained using a first modified Newton-Raphson scheme, made in accordance with the present invention, for solving the S-shaped functions shown in FIGS. 6A and 6B.
Figure 7B:
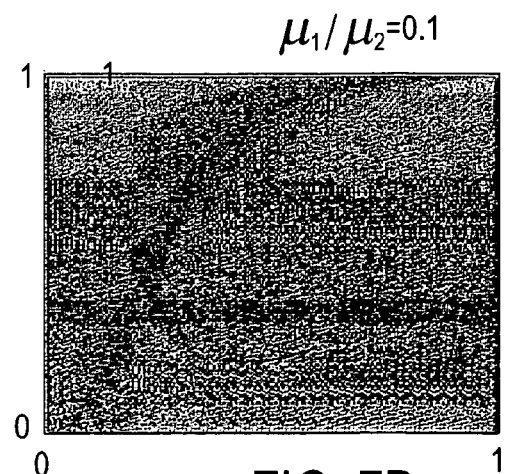

FIGS. 7A and 7B show convergence maps for the S-shaped flux functions of FIGS. 6A and 6B. However, this time a first modified Newton-Raphson scheme is applied of setting $S^{v+1}=S^c$ if the second derivatives of $f(S^v)$ and $f(S^{v+1})$ have opposite signs. This can be verified by calculating:

$$f''(S^v)f''(S^{v+1})<0 \tag{16}$$

If the product of second derivatives is negative, then $S^v$ and $S^{v+1}$ are on opposite sides of the inflection point $S^c$.

The horizontal axis represents the start value $S^0$ and the vertical axis is the target value F. Dark regions indicate fast convergence, and no convergence is achieved for the parameter pairs in white regions. Note that no white regions are present in FIGS. 7A and 7B and thus this first modified Newton-Raphson scheme is unconditionally stable. The application of this modification to the solution algorithm for the transport problem is straightforward and allows for arbitrarily large time steps.

It can be difficult to determine the exact location of the inflection point $S^c$. This is particularly true if a system of transport equations is solved, where the fractional flow functions depend on multiple variables. In some instances, lookup tables may be used to represent the fraction flow curve $fS)$ and the inflection points are not readily computed analytically. Also, finding the inflection point $S^c$ of the complex fraction flow functions can be computationally expensive.

Therefore, an alternative, and more preferred, second modified scheme is presented which is easier to implement in a realistic setting. This second scheme differs from the first scheme in the way $S^{v+1}$ is modified at the end of each Newton iteration where $S^v$ and $S^{v+1}$ are located on opposite sides of the inflection point $S^c$ of curve $f$. Instead of setting $S^{v+1}$ to $S^c$, a selective under-relaxation method is applied. For example, $S^{v+1}$ may be replaced by $0.5(S^v+S^{v+1})$, if the sign of the second derivative, i.e., $f''(S)=\partial^2 71/\partial S^2$, is not the same at the old and new iteration levels.

Other levels of relaxation may also be used. That is, the under-relaxation can be generalized by:

$$S^l=\alpha S^v+(1-\alpha)S^{v+1} \tag{17}$$

where $S^l$=a new estimate for S; and $\alpha$=an under-relaxation coefficient.

Figure 8:
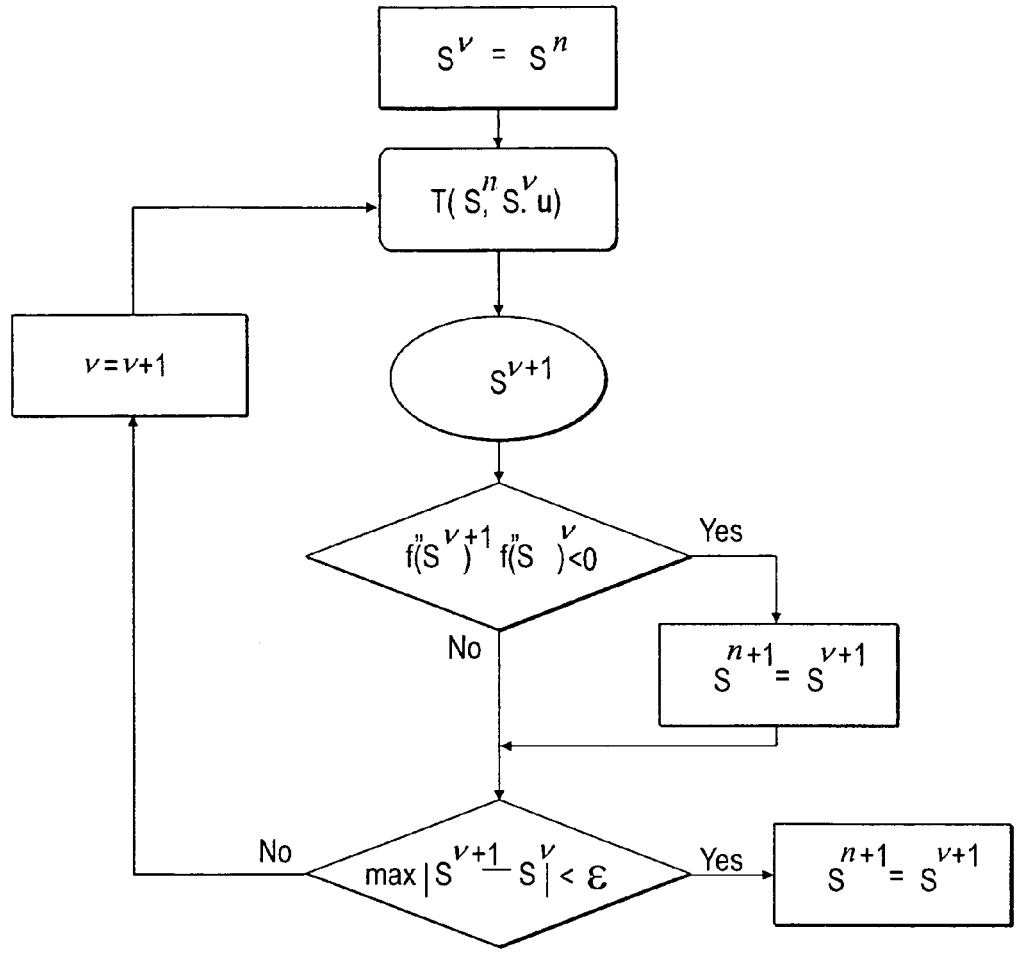
FIG. 8 is a flow diagram of a second modified Newton-Raphson scheme for one time step wherein solving the linearized transport equation is represented by operator T.

A flow diagram of this second enhanced scheme is depicted in FIG. 8. Since it is relatively easy to determine the second derivatives of f, this second alternative scheme can easily be implemented in an existing oil reservoir simulator as compared to the first modified scheme where $S^{v+1}$ is set to $S^c$ when $S^v$ and $S^{v+1}$ are on opposite sides of $S^c$.

Figure 9A:
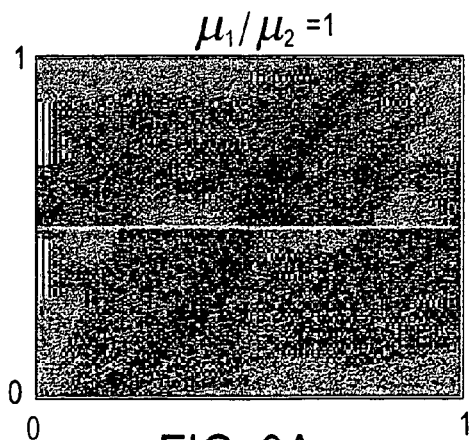
FIGS. 9A and 9B display convergence maps using a second embodiment of a modified Newton-Raphson scheme for solving the S-shaped functions shown in FIGS. 6A and 6B.
Figure 9B:
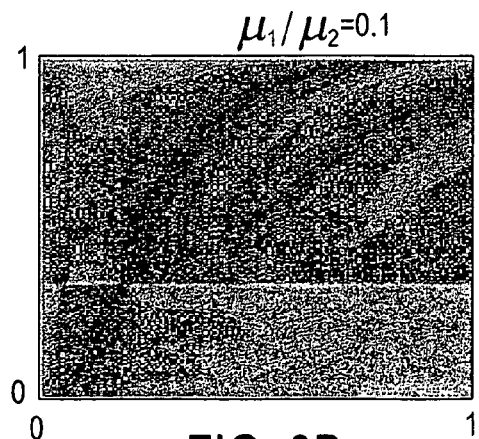
Figure 10A:
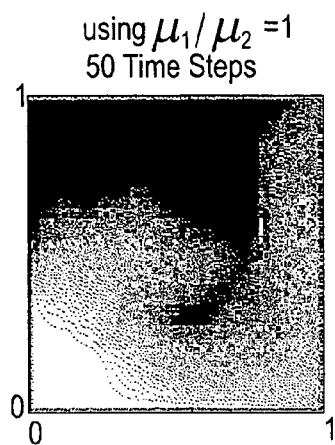
FIGS. 10A, 10B, 10C, 10D, 10E, 10F, 10G, 10H, and 10I, respectively, show saturation fields after time 0.5 Pore Volume Injected (PVI) for three ratios of viscosities $\mu_1/\mu_2$ and three time step sizes.
Figure 10B:
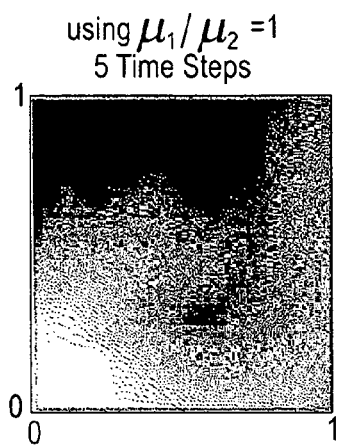
Figure 10C:
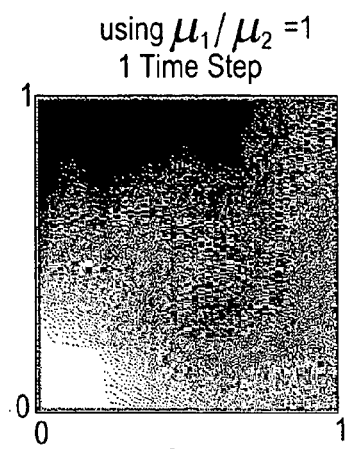
Figure 10D:
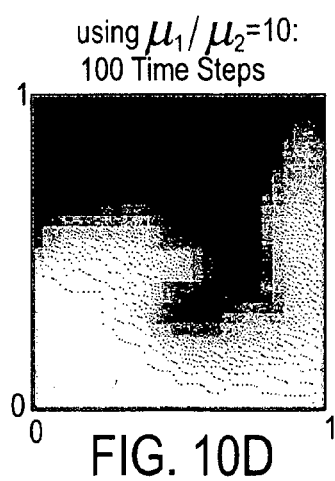
Figure 10E:
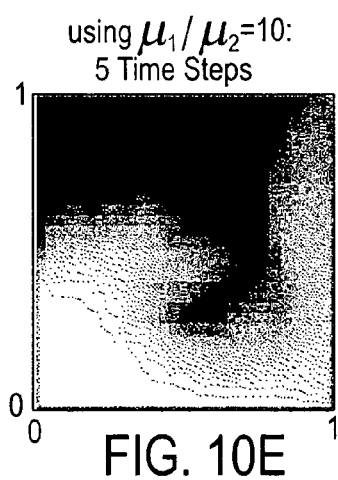
Figure 10F:
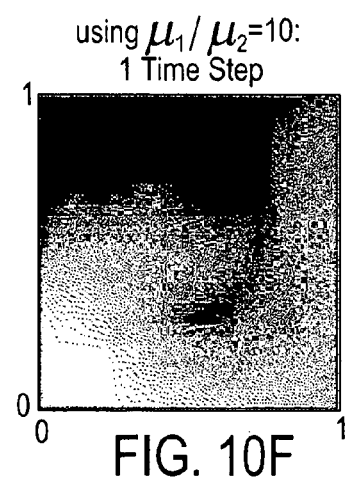
Figure 10G:
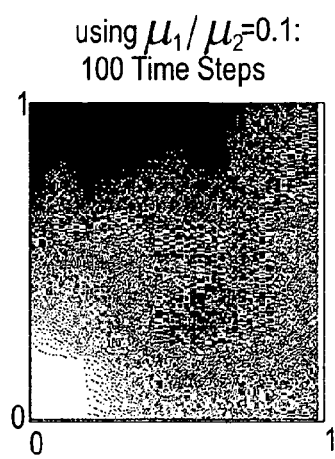
Figure 10H:
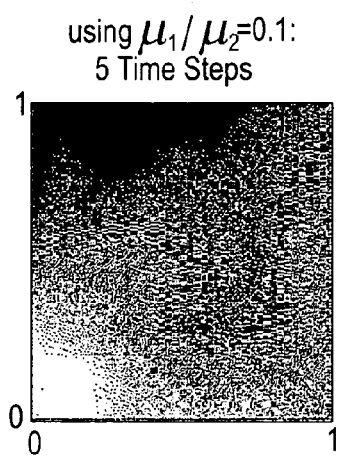
Figure 10I:
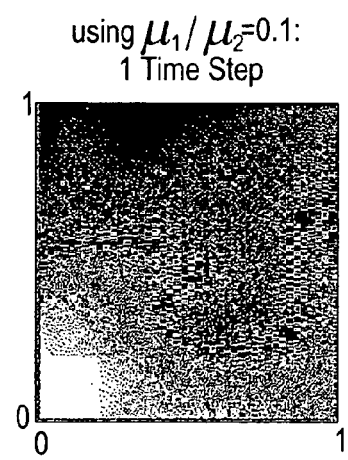

Analogue to the convergence maps shown in FIGS. 6C and 6D and FIGS. 7A and 7B, the corresponding convergence maps for the second alternative modification using selective under-relaxation are shown in FIGS. 9A and 9B. The horizontal axis represents the start value $S^0$ and the vertical axis represents the target value F. Dark regions indicate fast convergence, and no convergence is achieved for parameter pairs in white regions. As with the convergence maps of in FIGS. 7A and 7B, there are no white regions showing that this second alternative modification leads to an unconditionally stable scheme.

Both the first and second modifications work as predicted, if they are applied to the solution algorithm for nonlinear transport equations. The first and second modified schemes are almost equally efficient. Moreover, if the time step size is within the stable range for the unmodified or conventional Newton-Raphson scheme, no compromise in efficiency due to the modifications of this invention could be observed in numerical studies. On the other hand, efficiency is heavily compromised, if stability is achieved by applying under-relaxation everywhere at the end of each Newton iteration rather than selectively as in the modified schemes described above. Numerical results are presented in FIGS. 10A-I for the test case described above using S-shaped fractional flow functions defined by Eqn. (12). All simulations were performed with the first and second modified schemes and it is demonstrated that arbitrary large time steps can be applied. FIGS. 10A-I, respectively, show saturation fields obtained after time=0.5 PVI with $\mu_1/\mu_2=1$ (top row—FIGS. 10A, 10B, and 10C), $\mu_1/\mu_2=10$ (middle row—FIGS. 10D, 10E, and 10F), and $\mu_1/\mu_2=0.1$ (bottom row—FIGS. 10G, 10H, and 10I). The results in the left column of these plots were computed using 100 small time steps, or $\Delta t=0.005$ PVI, for which an unmodified Newton-Raphson scheme proved to be stable as well. Note that these time steps are half the size of those used to obtain the non-converging results shown in FIG. 4. The center and right columns of plots show results computed with $\Delta t=0.1$ PVI and $\Delta t=0.5$ PVI, respectively.

Figure 11:
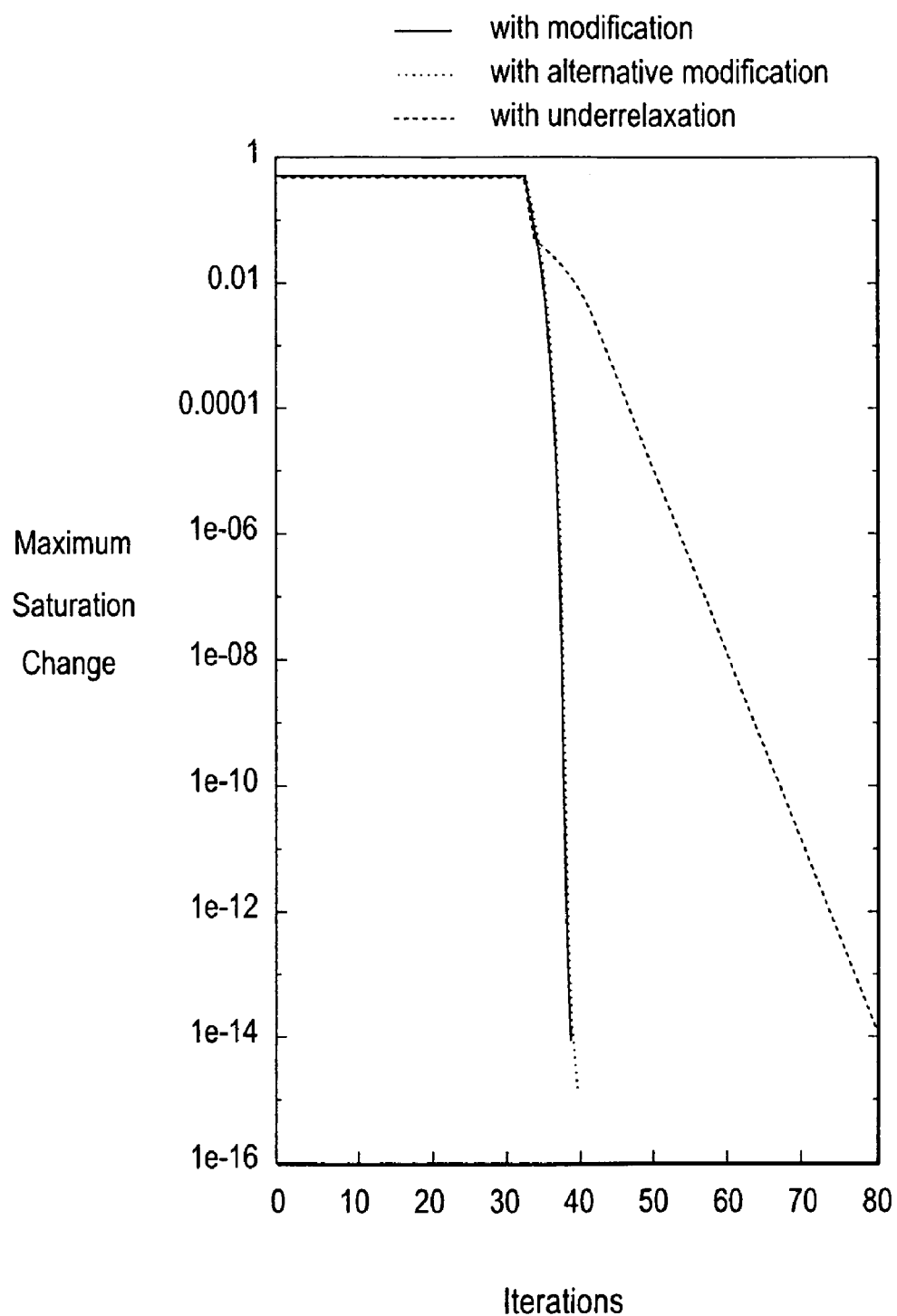
FIG. 11 illustrates convergence histories after time 0.5 PVI and $\mu_1/\mu_2=1$ using first and second modified Newton schemes and using a Newton scheme with constant under-relaxation.

FIG. 11 shows the results of using the above described first and second modified Newton-Raphson schemes wherein $S^{v+1}$ is selectively set to $S^c$ and $0.5(S^v+S^{v+1})$, respectively, only when the signs of the second derivatives, $f''(S^v)$ and $f''(S^{v+1})$, change in an iteration step. Further, a third scheme, was investigated wherein under-relaxation was applied at the end of every iteration, i.e., a naïve under-relation scheme. The vertical axis shows maximum saturation change in an iterative step and the horizontal axis shows number of iterations. FIG. 11 is plotted for the case where the time step size was 0.5 PVI and the ratio of viscosities $\mu_1/\mu_2$ was one. For all simulations performed, both the first and second modified schemes were tested and no noticeable difference in terms of required iterations could be observed. While the convergence rates of the first two schemes are essentially the same, the third scheme with naïve under-relaxation is shown to be much less efficient.

The modified Newton-Raphson schemes can also be applied as a building block for a solution algorithm, if mobility factor $\lambda$ is a function of the saturation. This is of particular interest for the oil industry. For the quadratic relative permeability case, mobility factor $\lambda$ is defined as:

$$\lambda = k\left(\frac{S^2}{\mu_1} + \frac{(1-S)^2}{\mu_2}\right) \tag{18}$$

where k is permeability;
S=saturation of a first phase;
$\mu_1$=viscosity of the first phase; and
$\mu_2$=viscosity of a second phase.

Figure 12:
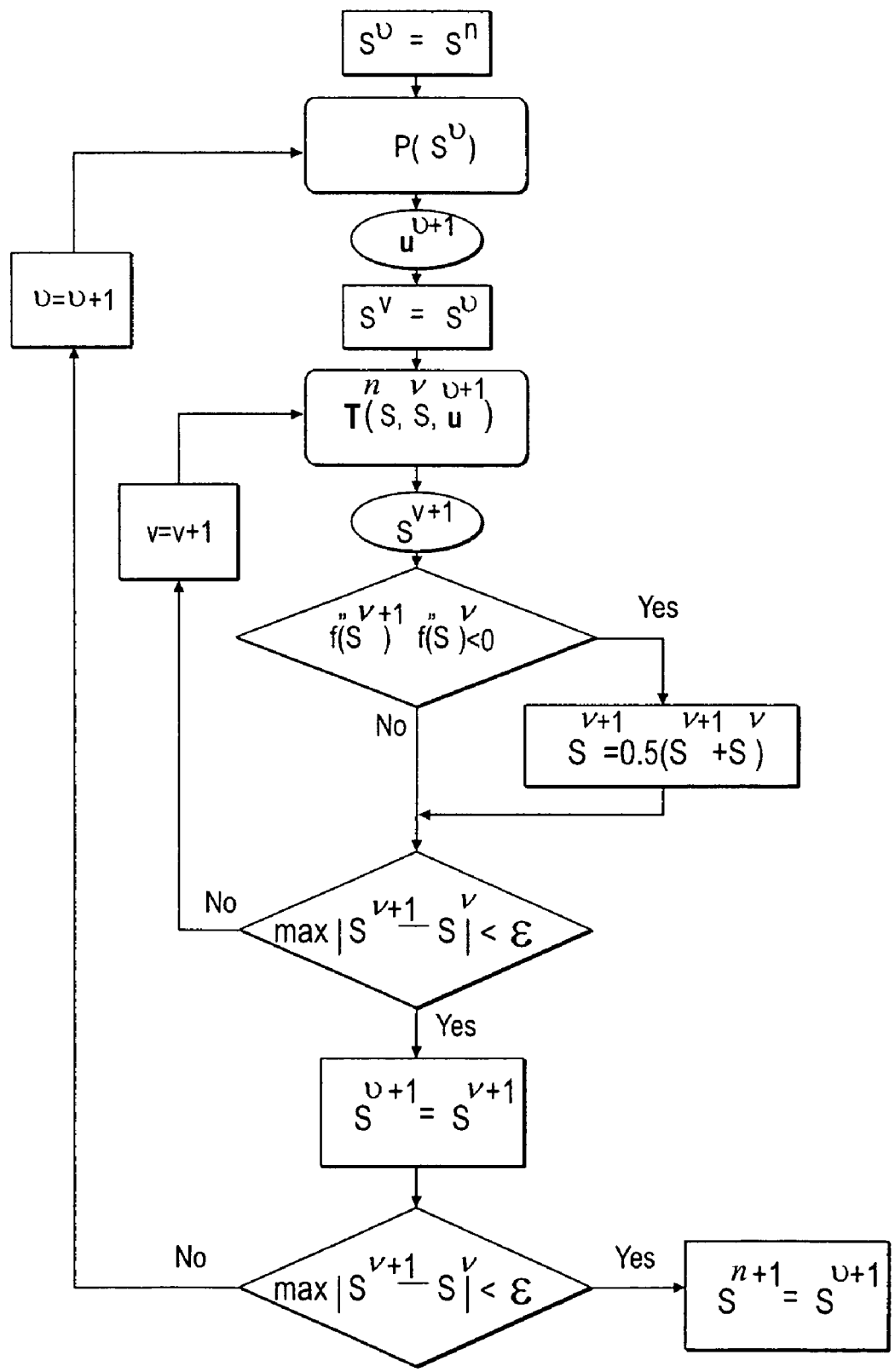
FIG. 12 is a flow diagram with a non-constant velocity field for one time step wherein solving a pressure equation is represented by the operator P and solving the linearized transport equation is represented by the operator T.

As a consequence of $\lambda$ being a function of the saturation, the velocity field u is no longer constant and has to be updated by solving the pressure Eqn. (18), if $\lambda$ changes. This algorithm is outlined by the flow diagram in FIG. 12. Note that the flow diagram of FIG. 8 reappears in the dashed box within the loop required to update the total velocity field u. This converged solution is identical to the solution obtained by a fully implicit scheme, where the pressure and transport equations are solved simultaneously.

Figure 13:
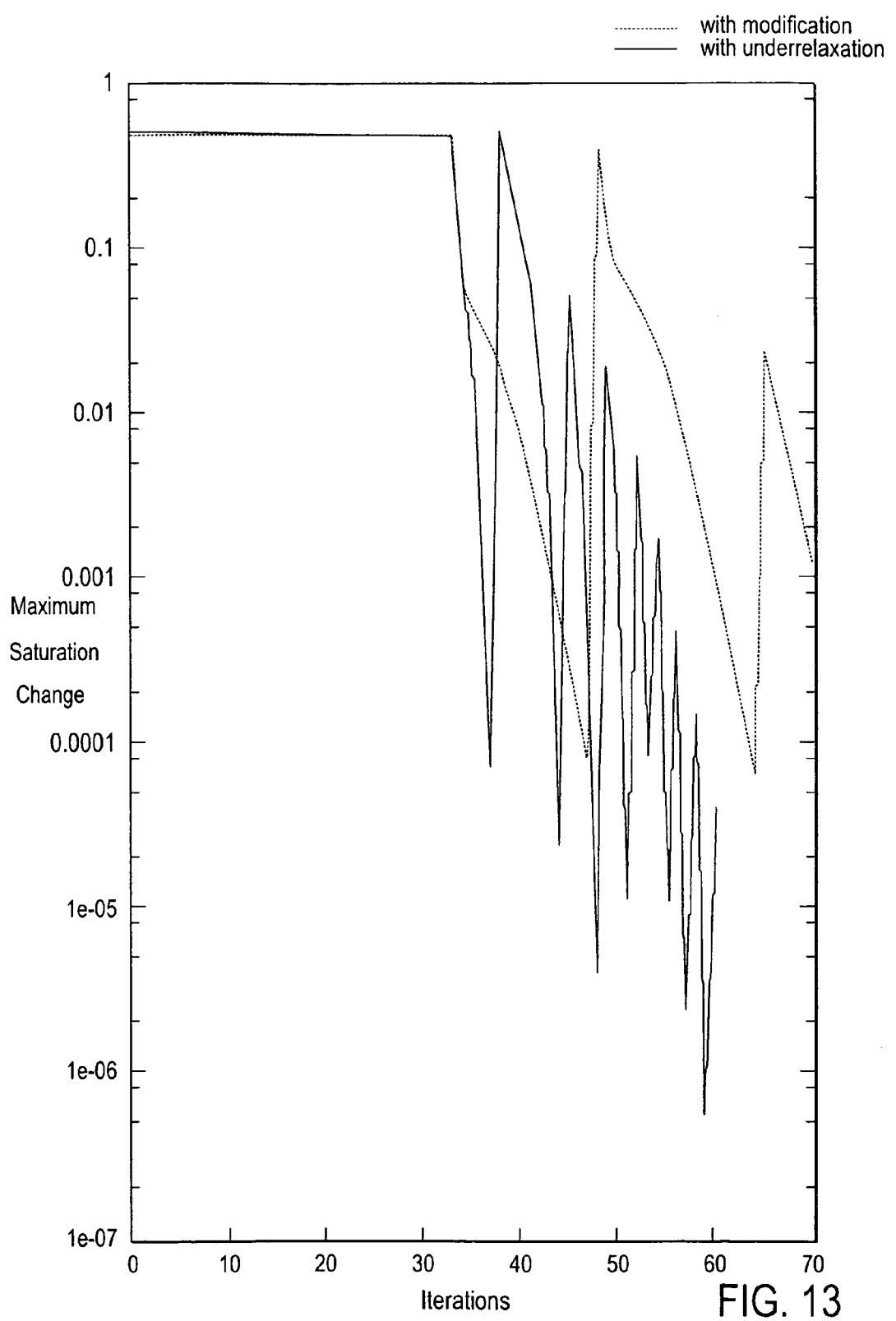
FIG. 13 shows the convergence histories of one time step for three simulations, two performed with modified Newton-Raphson schemes and a third using constant under-relaxation during all iterative steps.

FIG. 13 shows the convergence histories of one time step for two simulations, one performed with the modified Newton-Raphson solution algorithm using selective under-relaxation and the other one with a method using simple or naïve under-relaxation. The test case was the same as for the previous studies, the time step size was 0.5 PVI and the viscosity ratio $\mu_1/\mu_2=1$. With the modified algorithm, the linearized transport equation has to be solved approximately 60 times and the elliptic pressure equation only nine times (number of peaks in the convergence plot). Simple or naïve under-relaxation on the other hand proved to be much less efficient.

Exemplary Steps for Solving an S-Shaped Function for a Physical Property

Figure 14:
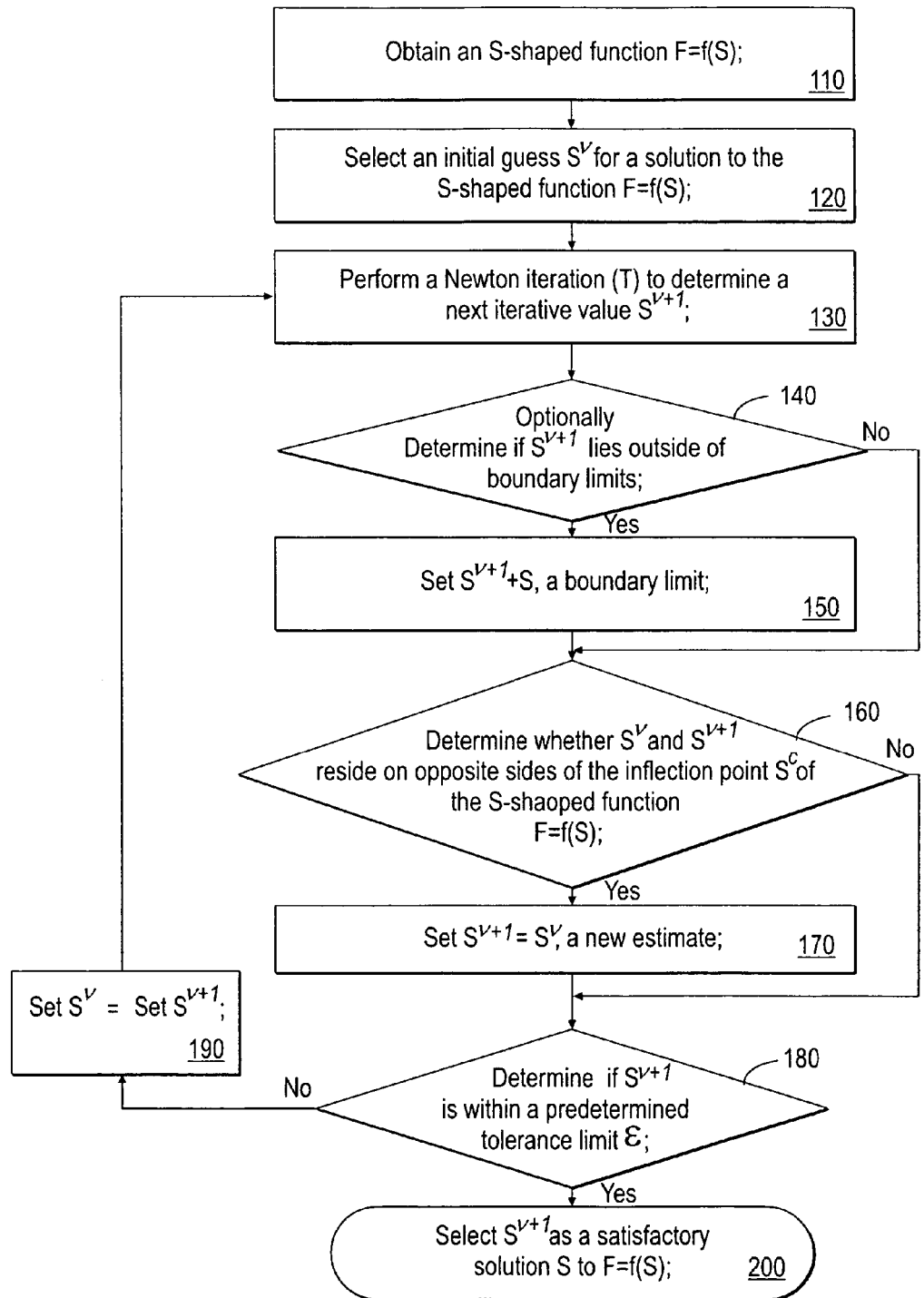
FIG. 14 is a flow diagram of steps taken in a preferred embodiment of the present invention to solve an S-shaped function, F=$f$S), for a physical property S, such as saturation.
Figure 15:
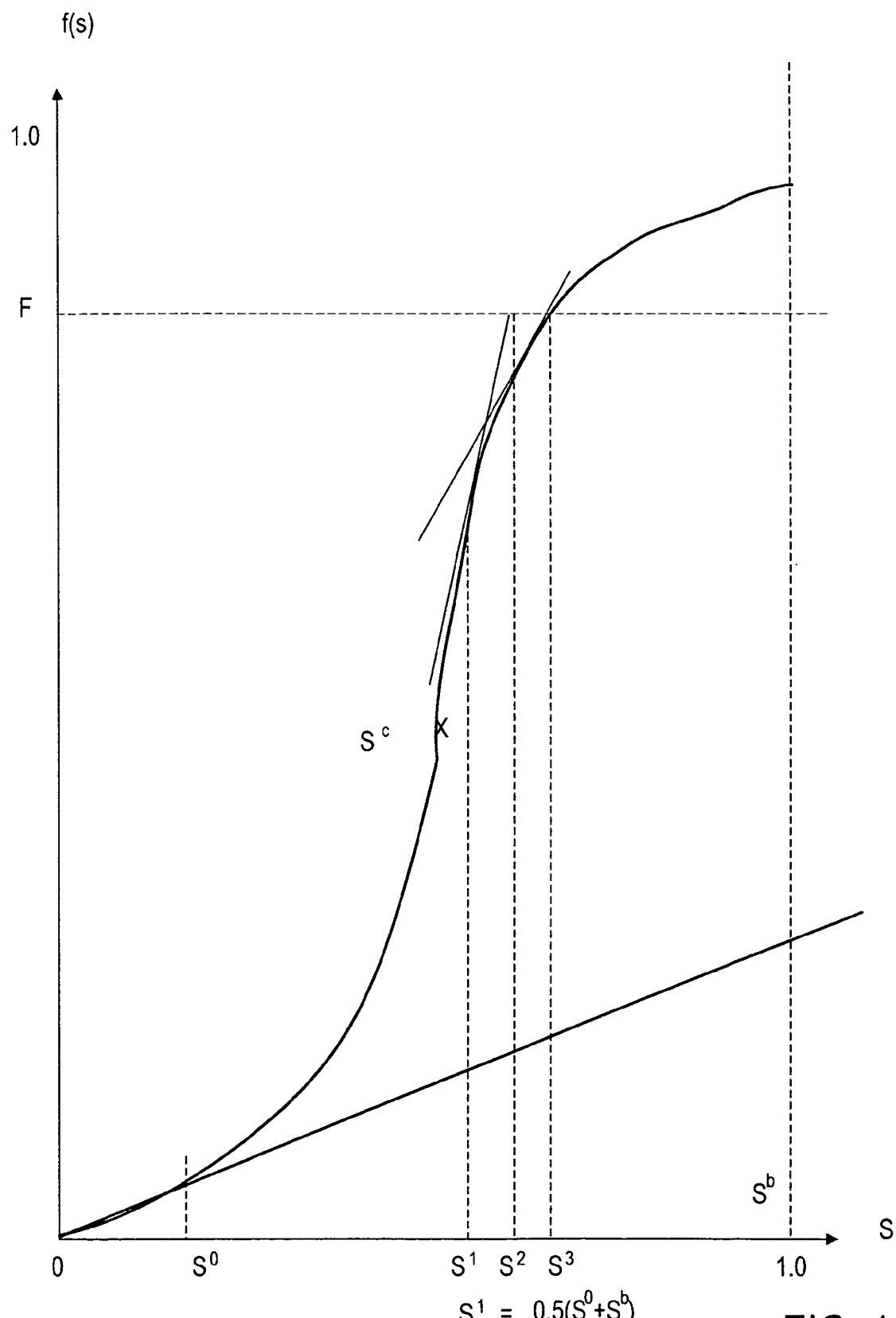
FIG. 15 graphically illustrates the iterative solution of an S-shaped function F=$f$S) using a modified Newton-Raphson scheme in accordance with the present invention.

The present invention includes a method and apparatus for stably solving non-linear S-shaped functions, $F=fS$), to determine a property S representative of a physical system. FIG. 14 illustrates a preferred exemplary flow diagram of steps which may be used to carry out the invention in accordance with principles described in the section above. FIG. 15 graphically illustrates a modified Newton scheme.

In this modified Newton-Raphson algorithm, the value for a next iteration, $S^{v+1}$, is set to a new estimate or stability limit $S^l$ in the event the signs of the second derivatives, $f''(S^v)$ and $f''(S^{v+1})$ of the S-shaped function change between successive iterations. The modified new estimate, or stability limit, $S^l$ is ideally selected such that the modified Newton-Raphson methodology is guaranteed to stably converge.

A first step 110 is to obtain an S-shaped function $fS$) which is representative of a property S in a physical system. For example, a physical system of particular interest is that of fluid flow in a subterranean reservoir. The S-shaped function $fS$) may be expressed in terms of a mathematical function, such as Eqn. (12) above, or else by way of a look-up table to capture the essence of the S-shaped function. As is well known to those skilled in the art of reservoir simulation, an S-shaped function, such as a fractional flow function, may be derived from laboratory tests based on relative permeability measurements.

Those skilled in the art of solving non-linear problems for physical systems will appreciate that the present invention, utilizing modified Newton-Raphson schemes, may be used to solve S-shaped functions which characterize properties of physical systems other than reservoir simulation.

The S-shaped function $fS$) is characterized by having at least a convex portion and a concave portion joined at an inflection point $S^c$. The function $fS$) is to be solved to determine a physical property S which satisfies the condition $F=fS$), where F is a target value. For example, in a reservoir simulation, when solving an S-shaped fractional flow function $fS$) for a saturation value S in a grid cell in a linearized transport problem, the flow flux value F from a previous time level is ideally used as the target value F. Alternatively, target value F may be established by non-linear iteration in numerical simulation.

An initial value or guess $S^v$ is selected in step 120 as a possible solution for the physical property S which satisfies the condition $F=fS$). This initial value for $S^v$ is preferably established by an initial condition or the results from a preceding time step. Although less preferred, the initial value for $S^{v+1}$ may also be made by an interpolation method or randomized method.

A Newton iteration, as suggested by the operator (T) in FIG. 8, is performed in step 130 on the function $fS$) utilizing the value $S^v$ of the present iteration to determine a next iteration value $S^{v+1}$. This Newton iteration corresponds to applying Eqn. (15) to the S-shaped function $fS$) to determine the next iterative value $S^{v+1}$. In FIG. 15, this initial guess is $S^0$.

An optional check may be made in step 140 to see whether $S^{v+1}$ is within an acceptable bound. For example, if the denominator in an S-shaped function, such as a function similar to that of Eqn. (12), were near zero, the estimated value for $S^{v+1}$ could be quite large. If $S^{v+1}$ exceeds certain boundary limits, such as saturation S being less than zero or greater than one, then $S^{v+1}$ may be set in step 150 to values such as 0.0 or 1.0 to maintain the physical property S, within realistic bounds. In the example of FIG. 15, the intercept of the tangent to point $(S^0, fS^0)$) with the horizontal line representing flow flux value F is seen not to occur within the upper saturation limit, $S^b=1.0$. Accordingly, $S^{v+1}$ in the case of the first iteration in FIG. 15, is set to the upper bound $S^b=1.0$.

A determination is then made in step 160 as to whether $S^v$ and $S^{v+1}$ reside on opposite sides of the inflection point $S^c$ of the S-shaped function $fS$). The preferred manner of making such a determination is to check to see whether the signs of the second derivative of $fS$), i.e., $f''(S)$, at $S^v$ and at $S^{v+1}$ are opposite one another. This can be verified utilizing Eqn. (16) to calculate the product of the $f''(S^v)$ and $f''(S^{v+1})$.

If the product of second derivatives is negative, then $S^v$ and $S^{v+1}$ are on opposite side of the inflection point. Another, although less preferred, manner of making this determination is to actually calculate the location of the inflection point $S^c$ and then see whether $S^v$ and $S^{v+1}$ are on the same side of $S^c$. The inflection point $S^c$ may be calculated by solving $f''(S)=0$. This may be done analytically if the function $fS$) is sufficiently simply or else numerically where $fS$) is complex. In the case of using a look-up table to define the S-shaped function $fS$), an initial table of values for $fS$), $f'(S)$ and $f''(S)$ may be generated. The look-up tables may then be examined to determine the location of the inflection point $S^c$. In FIG. 15, values of $S^0$ and $S^b$ are located on opposite sides of the inflection point $S^c$.

If $S^v$ and $S^{v+1}$ are on opposite sides of the inflection point $S^c$, then to guarantee unconditional stability in solving for S, $S^{v+1}$ is set to $S^l$, a new estimate or stability limit, in step 170. This modified estimate $S^l$ is selected to guarantee convergence of the Newton-Raphson iterations. In a first preferred embodiment, the modified estimate $S^l$ is set equal to the inflection point $S^c$. In a second and more preferred manner as shown in FIG. 15, an under-relaxation method is used to calculate $S^l$. Ideally, $S^l$ is calculated in accordance with the following equation:

$$S^l = \alpha S^v + (1-\alpha) S^{(v+1)} \tag{19}$$

where $0<\alpha<1$.

Preferably the range of $\alpha$ is $0.3<\alpha<0.7$, even more preferably $0.4<\alpha<0.6$, and most preferably, $\alpha=0.5$. With $\alpha=0.5$, $S^{v+1}$ or $S^l$ is set to $0.5(S^v+S^{v+1})$.

If it is determined that $S^v$ and $S^{v+1}$ are located on the same side of inflection point $S^c$, then $S^{v+1}$ is preferably left unaltered rather than being set to the modified estimate $S^l$, i.e., $S^c$ or $S^l=0.5(S^v+S^{v+1})$.

In step 180, a determination is made whether the current iterative value $S^{v+1}$ meets a predetermined tolerance condition. For example, it may be required that the difference between consecutive iterative values of $S^v$ and $S^{v+1}$ be sufficiently small. Mathematically, this may be expressed as:

$$\epsilon > |S^{v+1} - S^v| \tag{20}$$

where $\epsilon$ is a predetermined tolerance limit.

Alternatively, it may be required that:

$$\epsilon > |F - f(S^{v+1})| \tag{21}$$

in order to consider the solution $S^{v+1}$ to be sufficiently close to the exact solution.

If $S^{v+1}$ is not considered a satisfactory solution, then $S^v$ is set to $S^{v+1}$ in step 190 and steps 130-180 are continued until a value of $S^{v+1}$ converges to within the predetermined tolerance limit. FIG. 15 demonstrates how successive estimates for saturation $S^1$, $S^2$ and $S^3$, etc., converge toward the exact solution for saturation S. When sufficient convergence is reached, the physical value S is considered as being a satisfactory solution. In the case of a reservoir simulator, the saturation S in grid cells for the next time level $S^{n+1}$ can then be set to $S^{v+1}$ after convergence is reached for each of the grid cells over which the modified Newton iterations are being performed.

The present invention further includes an apparatus or program storage device readable by a machine, tangibly embodying a program of instructions. These instructions are executable by the machine to perform method steps for stably solving a non-linear S-shaped function, $F=f(S)$, which is representative of a property S in a physical system. The S-shaped function has an inflection point $S^c$ and a predetermined value of F to which $f(S)$ converges. The method comprises the following steps. An initial value $S^v$ for the possible solution to $F=f(S)$ is selected. A Newton iteration is performed on the function $f(S)$ at $S^v$ to determine a next iterative value $S^{v+1}$. A determination is then made as to whether $S^{v+1}$ is located on the opposite side of the inflection point $S^c$ from $S^v$. If $S^v$ and $S^{v+1}$ are on opposite sides, then $S^{v+1}$ is set equal to $S^l$, a modified new estimate. Next a check is made to determine whether $S^{v+1}$ is a satisfactory solution for the property S by determining if $S^{v+1}$ is within a predetermined convergence criteria. If $S^{v+1}$ is not satisfactorily converged, then $S^v$ is set equal to $S^{v+1}$. The above steps are repeated until $S^{v+1}$ is within the predetermined convergence criteria. When convergence is reached, $S^{v+1}$ is selected as a satisfactory solution to the problem $F=f(S)$.

II. Algorithm for Two-Phase Flow with Gravity and Capillary Pressure

The effects of gravity and capillary pressure on the numerical stability of the Newton-Raphson method will be examined for the non-linear transport equation for two-phase flow. Gravity and/or capillary pressure effects in reservoir simulation can incur counter current flow in cells of a reservoir. Such counter current flow can pose severe numerical instability in conventional reservoir simulators. By extending the method described above in section I, an unconditionally stable algorithm will be derived for the non-linear transport equation for two-phase flow with gravity and capillary pressure.

First, the gravity effect will be investigated on fractional flow curves. Then, fractional flow curves will be characterized by a characteristic parameter. An unconditionally stable algorithm for two-phase flow with gravity is then described. A modification is also provided to the unconditionally stable algorithm to include the effect of capillary pressure.

Gravity Effect

Darcy's law for two phase flow with gravity can be written as $$u_1 = \frac{k k_{r1}}{\mu_1}(\nabla p - \rho_1 g \nabla D) \quad (22)$$

$$u_2 = \frac{k k_{r2}}{\mu_2}(\nabla p - \rho_2 g \nabla D) \quad (23)$$

Here, k is permeability, u is phase velocity, $k_r$ is relative permeability, $\mu$ is viscosity, D denotes the depth and $\rho$ is density. The subscripts denote phase properties.

From Eqns. (22) and (23), it can be readily derived that:

$$u_1 = f_1(S)u - f_3(S)C_g \quad (24)$$

$$u_2 = f_2(S)u + f_3(S)C_g \quad (25)$$

where S denotes the saturation of phase 1 (i.e., water). The total velocity is defined as $$u = u_1 + u_2 \quad (26)$$

$$f_1 = \frac{k_{r1}}{k_{r1} + m k_{r2}} \quad (27)$$

$$f_2 = \frac{m k_{r2}}{k_{r1} + m k_{r2}} \quad (28)$$

$$f_3 = \frac{m k_{r1} k_{r2}}{k_{r1} + m k_{r2}} \quad (29)$$

Here, m is the viscosity ratio, $\mu_1/\mu_2$.

The velocity due to gravity force is characterized by variable, $C_g$, $$C_g = \frac{k g (\rho_1 - \rho_2)}{\mu_1 u_c} \nabla D \quad (30)$$

where $u_c$ is a characteristic velocity and D is the depth. Note that velocities u, $u_1$ and $u_2$ in Eqns. (24) and (25) are also nondimensionalized with respect to $u_c$.

Figure 16A:
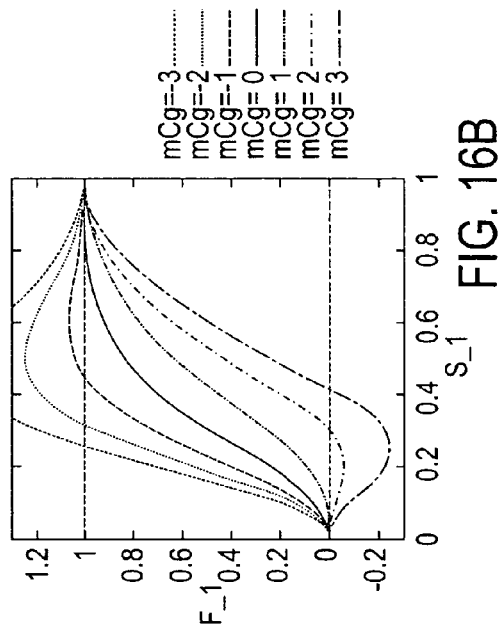
FIGS. 16A and B illustrate fractional flow curves for phase 1.
Figure 16B:
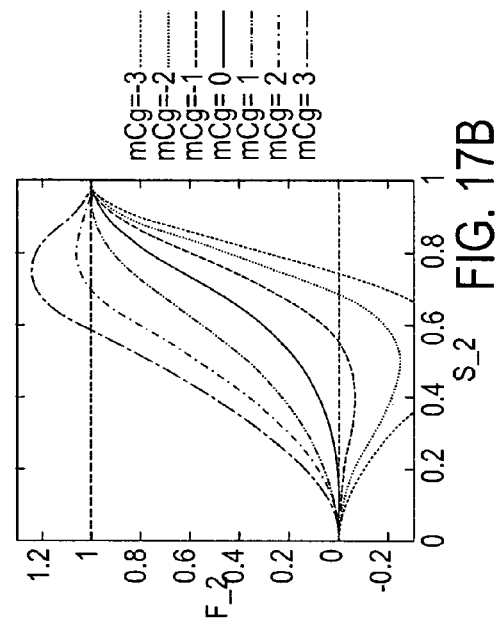
Figure 17B:
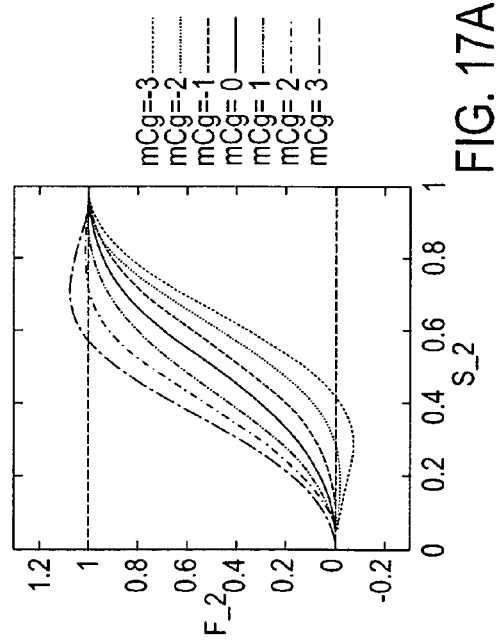

It is instructive to examine fractional flow curves from Eqns. (24) and (25). In FIGS. 16 and 17 the fractional flows are plotted for phases 1 and 2, respectively, $$F_1 = \frac{u_1}{u} \quad (31)$$

$$F_2 = \frac{u_2}{u}, \quad (32)$$

with quadratic relative permeabilities, $$k_{r1} = S_1^2 \quad (33)$$

$$k_{r2} = S_2^2 = (1 - S_1)^2. \quad (34)$$

The fractional flow curves are monotonic if $0 < mC_g \leq 1$, whereas it can become a multi-valued function for $mC_g > 1$ or $mC_g < 0$. Note that the fractional flow can be smaller than zero or larger than one, depending on the directions of gravity force and velocity. This can cause numerical difficulty if the Newton nonlinear iteration does not take the actual pattern of theses curves into account. Note that the fractional flow curve from negative $C_g$ and positive u is equivalent to that from positive $C_g$ and negative u. In practical simulation with fixed coordinates, $C_g$ can be kept always positive, but the mean velocity can be either positive or negative. Note that without loss of generality, the case with negative mean velocity is equivalent to the case of positive mean velocity with negative $C_g$ by selecting an appropriate coordinate to make the mean velocity positive.

If oil (lighter fluid) equation is chosen as a primary equation, from Eqn. (25) the saturation where the fractional flow of oil phase becomes zero $S^*_0$ or one $S^*_1$:

$$S^*_0 = 1 - \sqrt{|u|/C_g} \text{ for } u < 0, \text{ and} \quad (35)$$

$$S^*_1 = 1 - \sqrt{|u|/mC_g} \text{ for } u > 0. \quad (36)$$

If $mC_g/|u| \leq 1$ for $u > 0$, the fractional curve becomes a monotonic curve; whereas if $u < 0$ or $mC_g/|u| > 1$ for $u > 0$, the fractional flow curve includes a domain where the fractional curve becomes multi-valued (non monotonic). When the fractional flow curves has a minimum or maximum point, then there exists a reflection point which the saturation does not cross over in the non-linear iteration (see FIG. 19). This reflection point can be calculated analytically if the relative permeabilities are quadratic as in Eqns. (33) and (34).

$$0 = mS_r^{*3} - (1 - S_r^*)^3 + \frac{u}{C_g}. \tag{37}$$

The cubic equation can be solved analytically and always yields at least one real root:

$$S_r^* = \alpha + \left(-\frac{q}{2} + \frac{\sqrt{q^2 + 4p^3}}{2}\right)^{1/3} + \left(-\frac{q}{2} - \frac{\sqrt{q^2 + 4p^3}}{2}\right)^{1/3}; \tag{38}$$

$$\alpha = \frac{1}{1+m}; \tag{39}$$

$$p = \frac{1}{3}(3\alpha^2 + 2b\alpha + c); \tag{40}$$

$$q = (\alpha^3 + b\alpha^2 + c\alpha + d); \tag{41}$$

$$b = -\frac{3}{1+m}; \tag{42}$$

$$c = \frac{3}{1+m}; \tag{43}$$

and $$d = -\frac{1 - u/C_g}{1+m}. \tag{44}$$

where

The saturation can be divided into two domains: (1) $S > S_r^*$ and $S < S_r^*$. In general the saturation does not cross over the reflection point, but if the cell is next to the boundary with no-flow or next to the cell with the saturation of the other domain, the saturation should be allowed to cross over. The fractional flow curve does not apply due to the presence of the boundary that allows the fluid to accumulate without counter-current flow.

Finite Difference Approximation

The fractional flow curves in FIGS. 16 and 17 indicate that two phase flow can be co-current and counter-current, depending on the characteristic variable Cg and the viscosity ratio, m, and saturation S. As seen in FIG. 18, when the fractional flow in cell i and the neighboring cell n does not incur counter-current flow, a general up-wind finite difference approximation can be applied without ambiguity. However, if counter-current flow occurs in either cell i or cell n, as shown in FIG. 18, the upstream is phase dependent.

The phase split from the total velocity calculated in the pressure solution, as a result, entails a detailed information of co-current or counter-current flow between cells i and n. In FIG. 18 are depicted all the possible cases that can occur between cell i and its neighboring cell n. It is assumed that the total velocity from the pressure solution, $u_p$ is the velocity at the interface of cells i and n and the total velocities inside cells i and n are identical, say, u.

In cell i, the phase velocities that are co-current and counter-current are denoted with the total velocity u by $u_p^i$ and $u_r^i$, respectively. These phase velocities can be obtained from Eqn. (24) or (25). The equations can be expressed as $$u_p^i = f(u, S^i, C_g, m), \tag{45}$$

$$u_r^i = u - u_p^i. \tag{46}$$

Similarly, the phase velocities in cell n are obtained by $$u_p^n = f(u, S^n, C_g, m), \tag{47}$$

$$u_r^n = u - u_p^n. \tag{48}$$

If cell i is upstream, $$u_j = u_p^i + u_r^n \tag{49}$$

and if cell n is in upstream, $$u_j = u_p^n + u_r^i. \tag{50}$$

Note that it is assumed that a particular phase velocity can be co-current or counter-current depending on the flow and gravity directions. Furthermore, counter-current flow does not occur if $0 < mC_g \leq 1$.

In the sequential implicit algorithm, the saturation equations are iteratively solved with the total velocity fixed to preserve the conservation of mass (i.e., divergence free). This algorithm can be straightforwardly implemented by the total velocity and fractional flow formulation. However, for the case of counter-current flow, the original fractional flow that is dependent on a single saturation has to be modified in order to maintain mass conservation. If the phase velocity $u_i$ is determined from the upstream $\alpha_i$ cell, the fractional flow of the cell $\alpha_i$ can be expressed as:

$$u_i^{\alpha i} = k \frac{k_{ri}^{\alpha i}}{\mu_i^{\alpha i}}(\Delta p - \rho_i g \nabla D) \tag{51}$$

Then the total velocity can be written as:

$$u = \sum_l u_l^{\alpha l} = k \Delta p \sum_l \frac{k_{rl}^{\alpha l}}{\mu_l^{\alpha l}} - kg \nabla D \sum_l \frac{k_{rl}^{\alpha l} \rho_l g}{\mu_l^{\alpha l}}(\Delta p - \nabla D) \tag{52}$$

$$u_i^{\alpha i} = \frac{\lambda_i^{\alpha i}}{\lambda_T} u + kg \nabla D \frac{\lambda_i^{\alpha i}}{\lambda_T} \sum_l \lambda^{\alpha l}(\rho_l - \rho_i) \tag{53}$$

$$\lambda_l^{\alpha l} = \frac{k_{rl}^{\alpha l}}{\mu_l^{\alpha l}} \tag{54}$$

$$\lambda_T = \sum_l \lambda_l^{\alpha l}. \tag{55}$$

Stability Check

The stability issues of nonlinear transport problems lie in the linearization of the flux function. Note that the saturation equation is now a function of the cell saturation and all the upstream-cell saturations. The numerical schemes have been examined as to whether the schemes can converge from the initial saturation estimate, $0 \leq S^0 \leq 1$, for all cells, to the final saturation $S^v$ that satisfies the convergence criterion:

$$\lim_{v \to \infty} F(S^v) = F_0, \tag{56}$$

where $F_0$ is a right-hand-side vector. In Eqn. (56) the saturations are expressed in a vector notation. With the linearization of ƒS) around $S^v$, $$F(S^v) + \left(\frac{\partial F}{\partial S}\right)_v \cdot (S^{v+1} - S^v) = F_0. \quad (57)$$

one obtains the iteration equation $$S^{v+1} = S^v + (F_0 - F)_v \cdot \left(\frac{\partial F}{\partial S}\right)_v^{-1}. \quad (58)$$

In addition, $0 \leq S_j^{v+1} \leq 1$ for all j is enforced after each iteration.

In a 3-dimensional model of finite difference simulation, the gravity parameter, $C_g$, is dependent on the flow direction, (i.e., $C_g=0$ for horizontal flow $F_h$, and $C_g \neq 0$ for vertical flow $F_v$). As a result, two fractional flow curves have to be considered for horizontal $F_h$ and vertical flow $F_v$. The vertical flow $F_v$ may become a non-monotonic curve for $mC_g>1$. The lighter fluid saturation ($S_O$) equation is solved and the other phase is computed by the saturation constraint ($S_w=1-S_O$).

Consideration of Gravity

The effect of the additional consideration of gravity is potentially altering the fractional flow curve F=ƒS), Eqns. (31) and (32), so that those curves may contain a reflection point $S^*_r$. As described above, $C_g$, Eqn. (30) is calculated and is used in Eqns. (24) and (25) in ultimately establishing this fractional flow curve ƒS).

In the event that there is no countercurrent flow, the fractional flow curves will remain, as described in section I, without any reflection point $S^*_r$. However, if there is countercurrent flow, then curves, such as seen in FIGS. 19A-B may contain a reflection point $S^*_r$.

Regions I and II may be defined as the regions bifurcated by the reflection point $S^*_r$, with Region I being the region below the reflection point, $0<S<S^*_r$, and Region II being the region above $S^*_r<S<1.0$.

In the event that a grid cell for which $S^v$ is being evaluated is next to a no flow boundary, the above-described method of section I is applied without regard to any reflection point $S^*_r$. This is because countercurrent flow cannot occur under these conditions. Alternatively, if $S^v$ in adjacent cells i and n are in different regions I and II, then the above-described method of section I is used to allow the saturation $S^{v+1}$ to move across the reflection point $S^*_r$.

In the event grid cell i is (1) not next to a no-flow boundary or else (2) cells i and n are in the same region, then $S^{v+1}$ is determined for the particular region in which $S^v$ is located. For example, if $S^v$ is in region I, then $S^{v+1}$ will be maintained in region I. If ƒ"($S^v$)·ƒ"($S^{v+1}$)≧0, then no underelaxation is needed to ensure stability. $S^{v+1}$ will however be set to either 0 or $S^*_r$ in the event $S^{v+1}$ falls outside of region I. If ƒ"($S^v$)·ƒ" ($S^{v+1}$)<0, i.e. on the opposite side of the inflection point $S^c$ in that region, then underrelaxation will be used to insure stability. Again, if $S^{v+1}$ falls outside of region I in which $S^v$ is located, $S^{v+1}$ will be set to one of the lower or upper boundary limits, 0 or $S^*_r$, prior to the calculaton for the updated or underrelaxed value of $S^{v+1}$ being calculated, i.e. 0.5($S^v+S^{v+1}$).

Similarly, in region II, $S^v$ and $S^{v+1}$ are checked to see if $S^v$ and $S^{v+1}$ fall on the same side of the inflection point $S^c$ in region II. If so, no underrelaxation is needed for stability—only a check is made to insure the $S^{v+1}$ is within the range of Region II. If $S^v$ and $S^{v+1}$ are on opposite sides of the inflection point $S^c$ in that region, i.e. ƒ"($S^v$)·ƒ"($S^{v+1}$)<0, then underrelaxation is used, i.e. $S^{v+1}=0.5(S^v+S^{v+1})$. Again, $S^{v+1}$ must fall within region II prior to doing the subsequent underrrelaxation calculation.

Capillary pressure is easy to incorporate into the above steps. $C_g$ is simply set to $C_g-C_a$, as will be described below in Eqn. (65).

At this point $S^{v+1}$ has been determined for this iteration v+1 for this particular grid cell i. As described in Section I, a check for convergence is performed on each of the grid cells of the model or submodel to see whether convergence has been achieved in all grid cells so that a time step should be considered complete and no further Newton iterations are necessary for the time step.

Algorithm for Updating $S^v \rightarrow S^{V+1}$ in Grid Cell

The following algorithm may be used for two-phase flow with gravity.

1. Check the directions of phase velocities and gravity force.

2. If the phase velocities are co-current, apply the regular stability analysis;

Calculate the directional fractional flows and its second-order derivatives (F"$_h$ and F"$_v$);

Calculate $C_g$ for vertical flow (for horizontal flow, $C_g=0$); and

Apply saturation limit $0 \leq S^{v+1} \leq 1$.

If F"$_h$($S^{v+1}$)F"$_h$($S^v$)<0 or F"$_v$($S^{v+1}$)F"$_v$($S^v$)<0, apply an under-relaxation for saturation iteration: i.e., $S^{v+1}=0.5(S^v+S^{v+1})$.

3. If the phase velocities are counter-current;

Calculate the reflection saturation, $S^*_r$; and apply saturation limit: if the cell is not adjacent to the boundary or the neighboring cell doe not belong to the different saturation domain, $0 \leq S^{v+1} \leq S^*_r$ or $S^*_r < S^{v+1} < 1$, else $0 \leq S^{v+1} \leq 1$.

If F"$_h$($S^{v+1}$)F"$_h$($S^v$)<0 or F"$_v$($S^{v+1}$)F"$_v$($S^v$)<0, apply an under-relaxation for saturation iteration: i.e., $S^{v+1}=0.5(S^v+S^{v+1})$.

Capillary Pressure

In multiphase flow in porous media, fluids tend to have different pressures due to the wettability to rock and the surface tension between fluids. This capillary pressure is often modeled by a simple function of saturation:

$$p_c(S) = p_2 - p_1 \quad (59)$$

It is assumed that phase 1 is wetting and phase 2 is non-wetting. In general, the capillary pressure controls micro-scale flow in pores, but it plays a minor role in reservoir simulation scale. Therefore, it is not expected that capillary pressure changes any characteristics of the stability calculation of transport equation.

Darcy's law may be written with capillary pressure:

$$u_1 = -\frac{kk_{r1}}{u_1}(\nabla p_1 - \rho_1 g \nabla D) \quad (60)$$

$$u_2 = -\frac{kk_{r2}}{u_2}(\nabla p_2 - \rho_2 g \nabla D) \quad (61)$$

From Eqns. (59)-(61), $$u_1 = f_1(S)u - f_3(S)(C_g - C_a) \quad (62)$$

$$u_2 = f_2(S)u + f_3(S)(C_g - C_a) \quad (63)$$

where $$C_a = \frac{k}{\mu_1} \nabla p_c \qquad (64)$$

The transport equation does not change the characteristics due to the presence of capillary pressure. The effect of capillary pressure can be included by modifying the gravity parameter $C_g$. For the case of total velocity and gravity having different directions (i.e., phase 1 with $C_g > 0$), capillary pressure reduces the gravity effect. The capillary pressure includes the spacial gradient of capillary pressure ($\nabla p_c$), and it is expected that this term stays much smaller than the viscous term $\mu$ or gravity term $C_g$. If there is any capillary force, the same stability algorithm may be used by modifying $C_g$:

$$\tilde{C}_g = C_g - C_a. \qquad (65)$$

III. Algorithm for Three-Phase Flow with Gravity and Capillary Pressure

An unconditionally stable algorithm for three-phase flow with gravity and capillary pressure will now be described. In reservoir simulation, three-phase flow region is very limited in the model and more often the three-phase region in the model occur is due to the combination of two two-phase flow. As a result, it is not clear that three phase relative permeability measurements at laboratories can be directly applied for reservoir simulation. Furthermore, measurements of three-phase relative permeability are technically very difficult, M. J. Oak, L. E. Barker, and D. C. Thomas, *Three-phase relative permeability of Brea sandstone*, J. Pet. Tech., pages 1057-1061, 1990. For given uncertainties in experimental measurements and the scaling issues of grid-block relative permeabilities in a reservoir model, a simple power law model of relative permeabilites for the stability analysis is applied. The general characteristics of fractional flow curves for three phase flow will be examined. Based on the characteristics of the fractional flow curves, an unconditionally stable algorithm has been designed for three-phase flow with gravity and capillary pressure.

Three-Phase Flow

Three-phase flow in porous media is not well understood owing to the complexity of physical phenomena and practical difficulty in measuring three-phase relative permeability. However, in reservoir simulation, three-phase flow in a grid cell is often seen that may occur mostly by the combinations of two two-phase flows. Nevertheless, it entails three-phase relative permeabilities in reservoir simulation that may be an averaged value of two relative permeabilities for water-oil and oil-gas systems.

The modified Stone II method is often employed in many simulators in which oil relative permeability is modeled by a complicated functional form:

$$k_{ro} = k_{rocw}\left[\left(\frac{k_{row}}{k_{rocw}} + k_{rw}\right)\left(\frac{k_{rog}}{k_{rocw}} + k_{rg}\right) - k_{rw} - k_{rg}\right] \qquad (66)$$

Here, $k_{ro}$, $k_{rw}$, and $k_{rg}$ are oil, water and gas relative permeability, respectively. The $k_{rocw}$ is oil relative permeability at connate water saturation, $k_{row}$ is oil relative permeability in oil-water system, and $k_{rog}$ is oil relative permeability in oil-gas system. The water and gas relative permeabilities are the same as those given by a two phase system. The oil relative permeability of the modified Stone II method is found to become negative for some systems. Scant experimental evidence does not warrant employing a complex nonlinear functional form such as the Stone II method for three-phase relative permeability. A. Heiba, Three-phase relative permeability, *COFRC Technical Memorandum*, 1987, proposed a straight-line interpolation of $k_{row}$ and $k_{rog}$. For given uncertainties in experimental measurements and the scaling issues of grid-block relative permeabilities in a reservoir model, a simple power law model for the stability analysis may be used. The analysis can be further extended for any reasonable three-phase relative permeability models (no negative values or non-monotonic curves).

Three-phase flow with gravity will first be examined. As in two-phase flow stability analysis above, capillary pressure will later be included by modifying a gravity number.

Darcy's law for three phase flow can be written as:

$$u_i = \frac{kk_{ri}}{u_i}(\nabla p - \rho_i g \nabla D). \qquad (67)$$

Here, k is permeability, u is phase velocity, $k_r$ is relative permeability, $\mu$ is viscosity, D denotes the depth and $\rho$ is density. The subscript i denotes phase properties (i.e., i=1, 2, 3 for water, oil and gas phases, respectively). From Eqn. (67), it can be readily derived that:

$$u_1 = f_1(S_1,S_2,S_3)u - f_4(S_1,S_2,S_3)C_{g1} - f_5(S_1,S_2,S_3)C_{g2} \qquad (68)$$

$$u_2 = f_2(S_1,S_2,S_3)u + f_4(S_1,S_2,S_3)C_{g1} - f_6(S_1,S_2,S_3)C_{g3}, \text{ and} \qquad (69)$$

$$u_3 = f_3(S_1,S_2,S_3)u + f_5(S_1,S_2,S_3)C_{g2} - f_6(S_1,S_2,S_3)C_{g3}. \qquad (70)$$

The total velocity is defined as:

$$u = u_1 + u_2 + u_3 \qquad (71)$$

and the fractional parameters are given by $$f_1 = \frac{k_{r1}}{k_{r1} + m_2 k_{r2} + m_3 k_{r3}} \qquad (72)$$

$$f_2 = \frac{m_2 k_{r2}}{k_{r1} + m_2 k_{r2} + m_3 k_{r3}} \qquad (73)$$

$$f_3 = \frac{m_3 k_{r3}}{k_{r1} + m_2 k_{r2} + m_3 k_{r3}} \qquad (74)$$

$$f_4 = \frac{m_2 k_{r1} k_{r2}}{k_{r1} + m_2 k_{r2} + m_3 k_{r3}} \qquad (75)$$

$$f_5 = \frac{m_3 k_{r1} k_{r3}}{k_{r1} + m_2 k_{r2} + m_3 k_{r3}} \qquad (76)$$

$$f_6 = \frac{m_2 m_3 k_{r2} k_{r3}}{k_{r1} + m_2 k_{r2} + m_3 k_{r3}} \qquad (77)$$

where $m_i$ is the viscosity ratio with respect to the viscosity of phase 1, $\mu_1/\mu_i$. The velocity due to gravity force is characterized by variables, $C_{gi}$:

$$C_{g1} = \frac{kg(\rho_1 - \rho_2)}{\mu_1 u_c} \nabla D, \qquad (78)$$

-continued $$C_{g2} = \frac{kg(\rho_1 - \rho_3)}{\mu_1 u_c} \nabla D, \text{ and} \quad (79)$$

$$C_{g3} = C_{g2} - C_{g1}, \quad (80)$$

where $u_c$ is a characteristic velocity. Note that velocities u and $u_i$ in (68)-(70) are nondimensionalized with respect to $u_c$. Since there is a constraint for saturations:

$$1 = S_1 + S_2 + S_3, \quad (81)$$

only two equations in (68)-(70) are independent. Equations $u_1$ and $u_2$ are chosen for independent equations and also $S_1$ and $S_2$ are selected as independent variables by substituting $S_3$ with $1-S_1-S_2$.

It is instructive to examine fractional flow surfaces from Eqns. (68) and (69):

$$F_1 = \frac{u_1}{u} \quad (82)$$

$$F_2 = \frac{u_2}{u} \quad (83)$$

An example is chosen with typical mobility ratios, $m_2=0.2$ and $m_3=10$ and quadratic relative permeabilities, $$k_{ri} = S_i^2. \quad (84)$$

In FIGS. 20 and 21, the fractional flow surfaces are plotted for no gravity ($C_{g1}=C_{g2}=0$) and strong gravity ($C_{g1}=5$ and $C_{g2}=10$), respectively.

The fractional flow curves are monotonic for small $C_{g1}$ and $C_{g2}$, whereas it can become a multi-valued function for large $C_{g1}$ and $C_{g2}$. Note that depending on the directions of gravity force and velocity, the fractional flow can be smaller than zero or larger than one. This will cause numerical difficulty if the Newton nonlinear iteration does not take into account the actual pattern of these surfaces.

From (68) and (69) the bounding curves can be derived where the fractional flow becomes zero:

$$0 = u - m_2 C_{g1} k_{r2} - m_3 C_{g2} k_{r3}, \text{ and} \quad (85)$$

$$0 = u + C_{g1} k_{r1} - m_3 C_{g3} k_{r3}. \quad (86)$$

For quadratic relative permeabilities, Eqns. (85) and (86) become:

$$0 = u - m_2 C_{g1} S_2^2 - m_3 C_{g2}(1-S_1-S_2)^2, \text{ and} \quad (87)$$

$$0 = u + C_{g1} S_1^2 - m_3 C_{g3}(1-S_1-S_2)^2. \quad (88)$$

Stability Analysis

As noted above, the stability issues of nonlinear transport problems lie in the linearization of the flux function. The numerical schemes will be examined as to whether they can converge from the initial saturation estimate, $$\lim_{v \to \infty} F(S_1^v, S_2^v) = F^*, \quad (89)$$

$$\begin{pmatrix} F_1^v \\ F_2^v \end{pmatrix} + \begin{pmatrix} \frac{\partial F_1}{\partial S_1} & \frac{\partial F_1}{\partial S_2} \\ \frac{\partial F_2}{\partial S_1} & \frac{\partial F_2}{\partial S_2} \end{pmatrix} \begin{pmatrix} S_1^{v+1} - S_1^v \\ S_2^{v+1} - S_2^v \end{pmatrix} = \begin{pmatrix} F_1^* \\ F_2^* \end{pmatrix}, \text{ and} \quad (90)$$

$$\begin{pmatrix} S_1^{v+1} \\ S_2^{v+1} \end{pmatrix} = \begin{pmatrix} S_1^v \\ S_2^v \end{pmatrix} + \begin{pmatrix} \frac{\partial F_1}{\partial S_1} & \frac{\partial F_1}{\partial S_2} \\ \frac{\partial F_2}{\partial S_1} & \frac{\partial F_2}{\partial S_2} \end{pmatrix}^{-1} \begin{pmatrix} F_1^* - F_1^v \\ F_2^* - F_1^v \end{pmatrix}, \quad (91)$$

In addition, $0 \leq S^{v+1} \leq 1$ is enforced after each iteration.

Fractional Flow Surfaces

Figure 22B:
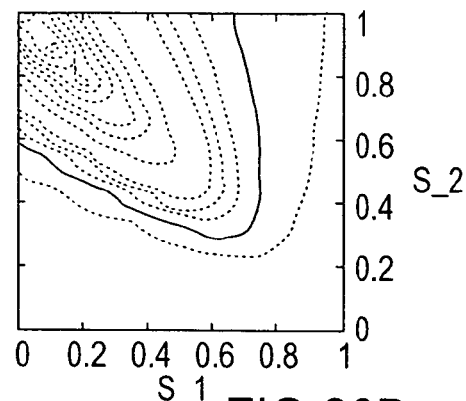
Figure 23B:
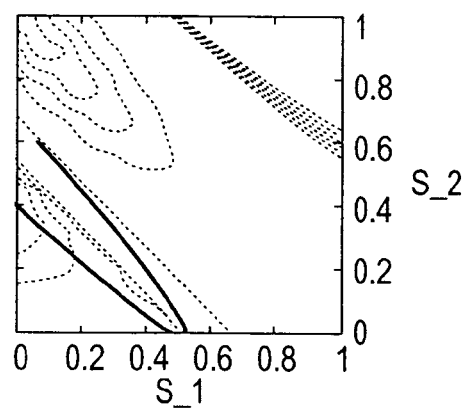
Figure 24B:
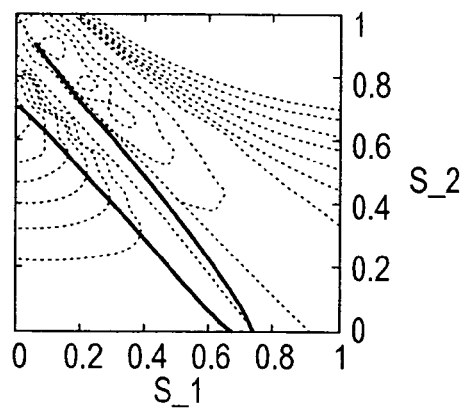

The fractional flow surfaces will now be examined to understand their general characteristics. In FIGS. 22, 23, and 24 the fractional flow isolines are plotted for three cases with no gravity ($C_{g1}=C_{g2}=0$), weak gravity ($C_{g1}=0.5$ and $C_{g2}=1$) and strong gravity ($C_{g1}=5$ and $C_{g2}=10$), respectively. Also applied is $m_1=0.2$ and $m_3=10$ for this plot. If there is no gravity, the fractional flow for each phase moves in the same direction of the total velocity. There is no negative flow domain in FIG. 22, where iso-fractional flow contours plotted from 0.1 to 0.9 with the interval of 0.1. Note that a large area of small phase one and two saturation has very weak fractional flows (<0.1). If the gravity is weak as in the second case, the domain of negative flow for phase 1 and 2 becomes smaller and the absolute magnitude of fractional flow also becomes smaller. In the positive fractional flow in FIGS. 23 and 24, the iso-fractional flow curves are contoured from 0 to 0.8 with the interval of 0.2; but in the negative fractional flow domain, different contour values are used for each figure: (−0.2, −0.4, −0.6, −0.8, −1, −2) for FIG. 23A, (−0.05, −0.1 −0.15, −0.2, −0.25, −0.3) for FIG. 23B, (−0.02, −0.04, −0.06, −0.08, −1, −2) for FIG. 24A, and (−0.05, −0.1 −0.15) for FIG. 24B. Also plotted are the contours of $u_1=0$ (upper dotted line) and $u_2=0$ (lower dotted line). Due to the complex contour curves in the negative flow domain, the Jacobian matrix of Eqn. (91) can become singular. The loci of singular points, where the determinant of the Jacobian matrix, Det, becomes zero, are also plotted with solid lines. A successful unconditionally stable algorithm should take into account the singular points of Jacobian matrix because the general Newton iteration cannot cross these singular lines.

The boundaries of zero fractional flow can be plotted for phase 1 ($F_1=0$) and phase 2 ($F_2=0$):

$$L_1(S_1, S_2): 0 = 1 - C_{g1} m_2 S_2^2 - C_{g2} m_3 (1-S_1-S_2)^2, \text{ and} \quad (92)$$

$$L_2(S_1, S_2): 0 = 1 + C_{g1} S_1^2 - C_{g3} m_3 (1-S_1-S_2)^2. \quad (93)$$

From Eqns. (93) and (94), the intersection point can be completed with $S_2=0$ axis. These points are denoted as $S_1^{\alpha 1}$ from (92) and $S_1^{\alpha 2}$ from (93), respectively. Two points are defined on these zero flux curves, $(S_1^{\beta 1} S_2^{\beta 1})$ and $(S_1^{\beta 2} S_2^{\beta 2})$, for better initial estimate of saturation that will be used in the algorithm described later.

$$S_1^{\beta 1} = \frac{2}{3} S_1^{\alpha 1} \text{ and } S_1^{\beta 2} = \frac{1}{3} S_1^{\alpha 2} \quad (94)$$

$$L_1(S_1^{\beta 1}, S_2^{\beta 1}): 0 = 1 - C_{g1} m_2 (S_2^{\beta 1})^2 - C_{g2} m_3 (1 - S_1^{\beta 1} - S_2^{\beta 1})^2, \text{ and} \quad (95)$$

$$L_2(S_1^{\beta 2}, S_2^{\beta 2}): 0 = 1 + C_{g1} (S_1^{\beta 2})^2 - C_{g3} m_3 (1 - S_1^{\beta 2} - S_2^{\beta 2})^2. \quad (96)$$

A point is denoted in the middle of the domain for $F^*_1 < 0$, $F^*_2 < 0$, and Det>0, $(S_1^{\beta 3}, S_2^{\beta 3})$ (i.e., (0.3, 0.3) in FIG. 24A).

Algorithm for Updating $S^v \to S^{v+1}$ in Three Phase Flow with Gravity and Capillary Pressure
1. Check the directions of total velocity and gravity force;
2. Calculate $C_{g1}$ and $C_{g2}$;
3. Calculate the boundaries of zero fractional flow for phase 1 ($L_1(S_1,S_2)$) and $L_2(S_1,S_2)$);
4. Calculate the initial points for saturation, $(S_1^{\beta1}, S_2^{\beta1})$ and $(S_1^{\beta2}, S_2^{\beta2})$ on $L_1(S_1,S_2)$ and $L_2(S_1,S_2)$, respectively;
5. Check the sign of $F^*_1$ and $F^*_2$;
6. From the initial estimate of saturations $(S_1^0$ and $S_2^0)$, calculate the fractional flow estimate $(F_1^0$ and $F_2^0)$ and the determinant Det of the Jacobian matrix;
7. If $F^*_1 \geq 0$ and $F^*_2 \geq 0$;
    (a) If the initial guess of the saturation does not yield the positive condition, take the point at $L_1(S_1^{\beta1}, S_2^{\beta1})$ as the initial guess;
    (b) Iterate the saturations based on Eqn. (91);
    (c) If $F_1^v < 0$ or $F_2^v < 0$, set saturation at $L_1(S_1^{\beta1}, S_2^{\beta1})$;
    (d) If $S_1 + S_2 > 1$, normalize the saturation to ensure $S_i \geq 0$;
    (e) If $$\frac{\partial^2 F_1^{v+1}}{\partial S_1^2} \frac{\partial^2 F_1^v}{\partial S_1^2} < 0, \text{ or } \frac{\partial^2 F_1^{v+1}}{\partial S_2^2} \frac{\partial^2 F_1^v}{\partial S_2^2} < 0,$$

<0, under-relax the saturation iteration, i.e., $S^{v+1} = (S^v + S^{v+1})/2$;
8. If $F^*_1 < 0$, $F^*_2 \geq 0$, and Det$\geq 0$, set the initial saturation estimate at point at $L_1(S_1^{\beta1}, S_2^{\beta1})$ as the initial guess;
9. If $F^*_1 < 0$, $F^*_2 \geq 0$, and Det<0, or $F^*_1 < 0$, $F^*_2 < 0$, and Det<0, set the initial saturation estimate at point $L_1(S_1^{\beta2}, S_2^{\beta2})$ as the initial guess; and
10. If $F^*_1 < 0$, $F^*_2 < 0$, and Det>0 set the initial saturation estimate at point at $(S_1^{\beta3}, S_2^{\beta3})$ as the initial guess.

Alternative Algorithm for Three Phase Stability

When three phase flow is modeled as a combination of two two-phase flow domains (i.e., gas-oil and oil-water domains), the stability algorithm can be modified as follows. The fraction of two-phase flow domain and their saturations (e.g., gas-oil and oil-water phases) are determined from three phase relative permeability approximations (e.g., oil saturation is uniform in the two domains or oil relative permeability is identical in the two domains). The stability analysis for two-phase flow is applied for each domain in Newton-Raphson iterations. If the unstable saturation change occurs in either one of the two domains, an under-relaxation procedure is taken to warrant a stable convergence of the Newton-Raphson iterations.

Capillary Pressure

In multiphase flow in porous media, the fluids tend to have different pressure due to their wettability to rock and interfacial tension between fluids. This capillary pressure is often modeled by a simple function of saturation. In three-phase flow, we have two independent capillary pressure curves:

$$p_{c1}(S_1, S_2) = p_2 - p_1, \text{ and} \tag{97}$$

$$p_{c2}(S_1, S_2) = p_3 - p_1. \tag{98}$$

The capillary pressure controls micro-scale flow in pores, but it plays a very minor role in reservoir simulation. It is not expected capillary pressure changes any characteristics of the stability calculation of transport equation.

Darcy's law may be written with capillary pressure:

$$u_1 = -\frac{kk_{r1}}{\mu_1}(\nabla p_1 - \rho_1 g \nabla D), \tag{99}$$

$$u_2 = -\frac{kk_{r2}}{\mu_2}(\nabla p_2 - \rho_2 g \nabla D), \text{ and} \tag{100}$$

$$u_3 = -\frac{kk_{r3}}{\mu_3}(\nabla p_3 - \rho_3 g \nabla D). \tag{101}$$

Eqns. (97)-(101) yield:

$$u_1 = f_1(S_1, S_2)u - f_4(S_1, S_2)(C_{g1} - C_{a1}) - f_5(S_1, S_2)(C_{g2} - C_{a2}) \tag{102}$$

$$u_2 = f_2(S_1, S_2)u - f_4(S_1, S_2)(C_{g1} - C_{a1}) - f_6(S_1, S_2)(C_{g3} - C_{a3}) \tag{103}$$

where $$C_{a1} = \frac{k}{\mu_1} \nabla p_{c1}, \tag{104}$$

$$C_{a2} = \frac{k}{\mu_1} \nabla p_{c2}, \tag{105}$$

$$C_{a3} = C_{a2} - C_{a1}. \tag{106}$$

Note that the transport equation do not change the characteristics due to the presence of capillary pressure. The effect of capillary pressure can be included by the gravity parameter $C_g$. For the case of total velocity and gravity have different directions (i.e., phase 1 with $C_g > 0$), capillary pressure reduces the gravity effect. Since the capillary pressure includes the spatial gradient of capillary pressure ($\nabla p_c$), this term is expectd to stay much smaller than the viscous term u or gravity term $C_g$. If there is capillary force, the same algorithm of section II can be used by modifying $C_g$:

$$\tilde{C}_{gi} = C_{gi} - C_{a1}. \tag{107}$$

What is claimed is:

1. A method for modeling with a reservoir simulator by solving a non-linear S-shaped function $F = f(S)$ which is representative of a property S in a physical subterranean reservoir system having fluid flow therein, the S-shaped function having an inflection point $S^c$ and a predetermined value of F to which $f(S)$ converges, the method comprising the steps of:
    a) by a computer, selecting an initial value $S^{v+1}$ as a potential solution to the function $f(S)$;
    b) performing a Newton iteration (T) on the function $f(S)$ at $S^v$ to determine a next iterative value $S^{v+1}$;
    c) determining whether $S^{v+1}$ is located on the opposite side of the inflection point $S^c$ from $S^v$;
    d) setting $S^{v+1} = S^I$, a modified new estimate, if $S^{v+1}$ is located on the opposite side of the inflection point of $f(S)$ from $S^v$;
    e) determining whether $S^{v+1}$ is within a predetermined convergence criteria;
    f) setting $S^v = S^{v+1}$ if $S^{v+1}$ is not within a predetermined convergence criteria;
    g) repeating steps (b)-(f) until $S^{v+1}$ is within the predetermined convergence criteria;
    h) selecting $S^{v+1}$ as a satisfactory solution S to the S-shaped function $F = f(S)$; and i) utilizing the satisfactory solution S to the S-shaped function $f(S)$ for modeling the fluid flow within the subterranean reservoir with the reservoir simulator.

2. The method of claim 1 wherein the modified new estimate $S^I$ is set to $S^I = \alpha S^v + (1-\alpha)S^{v+1}$, where $0<\alpha<1$.

3. The method of claim 2 wherein $\alpha=0.5$.

4. The method of claim 2 wherein $0.3<\alpha<0.7$.

5. The method of claim 1 wherein the stability limit $S^I$ is set to $S^c$, the inflection point of the function $f(S)$.

6. The method of claim 1 wherein the S-shaped function $f(S)$ is a fractional flow function utilized in the reservoir simulator to represent characteristics of the fluid flow within the subterranean reservoir.

7. The method of claim 1 wherein the S-shaped function $f(S)$ mathematically comports with the following mathematical expression:

$$f(S) = \frac{\frac{S^2}{\mu_1}}{\frac{S^2}{\mu_1} + \frac{(1-S)^2}{\mu_2}}$$

where S=saturation of a first phase in a two fluid flow problem;
$f(S)$=a function of saturation S;
$\mu_1$=viscosity of fluid in a first phase; and
$\mu_2$=viscosity of fluid in a second phase.

8. The method of claim 1 wherein $S^{v+1}$ is within the predetermined convergence criteria if $\epsilon > |S^{v+1} - S^v|$ where $\epsilon$ is predetermined tolerance limit.

9. The method of claim 1 wherein $S^{v+1}$ is within the predetermined convergence criteria if $\epsilon > |F - f(S^{v+1})|$ where $\epsilon$ is predetermined tolerance limit.

10. The method of claim 1 further comprising setting $S^{v+1}$ to an upper or lower bound $S^b$ if $S^{v+1}$ exceeds those bounds in step (b).

11. The method of claim 1 wherein the S-shaped function $F=f(S)$ is characterized by one of a look-up table or a general analytical function.

12. A program storage device readable by a machine, tangibly embodying a program of instructions executable by the machine to perform method steps for solving a non-linear S-shaped function, $F=f(S)$, which is representative of a property S in a physical subterranean reservoir system having fluid flow therein, the S-shaped function having an inflection point $S^c$ and a predetermined value of F to which $f(S)$ converges, the method comprising the steps of:

a) by a computer, selecting an initial value $S^v$ as a potential solution to the function $f(S)$;
b) performing a Newton iteration (T) on the function $f(S)$ at $S^v$ to determine a next iterative value $S^{v+1}$;
c) determining whether $S^{v+1}$ is located on the opposite side of the inflection point $S^c$ from $S^v$;
d) setting $S^{v+1} = S^I$, a modified new estimate, if $S^{v+1}$ is located on the opposite side of the inflection point of $f(S)$ from $S^v$;
e) determining whether $S^{v+1}$ is within a predetermined convergence criteria;
f) setting $S^v = S^{v+1}$ if $S^{v+1}$ is not within a predetermined convergence criteria;
g) repeating steps (b)-(f) until $S^{v+1}$ is within the predetermined convergence criteria;
h) selecting $S^{v+1}$ as a satisfactory solution to the S-shaped function $F=f(S)$; and
i) utilizing the satisfactory solution S to the S-shaped function $f(S)$ for modeling the fluid flow within the subterranean reservoir with the machine.

13. A method for updating a Newton's iteration for a fractional flow function $f(S)$ associated with two-phase flow of a physical subterranean reservoir system with gravity in a grid cell of a reservoir simulator, the method comprising:

(a) by a computer, checking the directions of phase velocities and gravity force in a grid cell;
(b) if the phase velocities are co-current, applying a regular Newton stability analysis;
  (i) calculating the directional fractional flows $F_h$ and $F_v$ and its second-order derivatives ($F''_h$ and $F''_v$);
  (ii) calculating $C_g$ for vertical flow (for horizontal flow, $C_g=0$);
  (iii) applying a saturation limit $0 \leq S^{v+1} \leq 1$;
  (iv) if $F''_h(S^{v+1})F''_h(S^v)<0$ or $F''_v(S^{v+1})F'''_v(S^v)<0$, apply an under-relaxation for saturation iteration;
(c) if the phase velocities are counter-current;
  (i) calculating a reflection saturation, $S^*_r$;
  (ii) applying a saturation limit: if the cell is not adjacent to the boundary or the neighboring cell does not belong to the different saturation domain, $0 \leq S^{v+1} \leq S^*_r$ or $S^*_r < S^{v+1} < 1$, else $0 \leq S^{v+1} \leq 1$;
  (iii) if $F''_h(S^{v+1})F''_h(S^v)<0$ or $F''_v(S^{v+1})F'''_v(S^v)<0$, applying an under-relaxation for saturation iteration; and
(d) utilizing the updated Newton's iteration for modeling the two-phase flow of the physical subterranean reservoir system with the reservoir simulator.

14. A method for updating a Newton's iteration for a fractional flow function $f(S)$ associated with three-phase flow of a physical subterranean reservoir system with gravity in a grid cell of a reservoir simulator, the method comprising:

(a) by a computer, checking the directions of total velocity and gravity force;
(b) calculating $C_{g1}$ and $C_{g2}$;
(c) calculating boundaries of zero fractional flow for phase 1, ($L_1(S_1, S_2)$) and $L_2(S_1, S_2)$;
(d) calculating initial points for saturation, $(S_1^{\beta 1}, S_2^{\beta 1})$ and $(S_1^{\beta 2}, S_2^{\beta 2})$ on $L_1(S_1, S_2)$ and $L_2(S_1, S_2)$, respectively;
(e) checking the sign of $F^*_1$ and $F^*_2$;
(f) from an initial estimate of saturations ($S_1^0$ and $S_2^0$), calculating a fractional flow estimate ($F_1^0$ and $F_2^0$) and a determinant of a Jacobian matrix;
(g) if $F^*_1 \geq 0$ and $F^*_2 \geq 0$;
  (i) if the initial estimate of the saturations does not yield a positive condition, take the point at $L_1(S_1^{\beta 1}, S_2^{\beta 1})$ as the initial estimate of the saturations;
  (ii) iterate the saturations based on $$\begin{pmatrix} S_1^{v+1} \\ S_2^{v+1} \end{pmatrix} = \begin{pmatrix} S_1^v \\ S_2^v \end{pmatrix} + \begin{pmatrix} \frac{\partial F_1}{\partial S_1} & \frac{\partial F_1}{\partial S_2} \\ \frac{\partial F_2}{\partial S_1} & \frac{\partial F_2}{\partial S_2} \end{pmatrix}^{-1} \begin{pmatrix} F_1^* - F_1^v \\ F_2^* - F_1^v \end{pmatrix}$$

where $0 \leq S^{v+1} \leq 1$ is enforced after each iteration;
  (iii) if $F_1^v < 0$ or $F_2^v < 0$, set the saturation at $L_1(S_1^{\beta 1}, S_2^{\beta 1})$;
  (iv) if $S_1 + S_2 > 1$, normalize the saturation to ensure $S_1 \geq 0$;
  (v) if $$\frac{\partial^2 F_1^{v+1}}{\partial S_1^2} \frac{\partial^2 F_1^v}{\partial S_1^2} < 0, \text{ or } \frac{\partial^2 F_1^{v+1}}{\partial S_2^2} \frac{\partial^2 F_1^v}{\partial S_2^2} < 0,$$

under-relax the saturation iteration;
(h) if $F^*_1 < 0$, $F^*_2 \geq 0$, and $Det \geq 0$, set the initial estimate of the saturations at point at $L_1(S_1^{\beta 1}, S_2^{\beta 1})$;

(i) if $F^*_1<0$, $F^*_2 \geqq 0$, and Det<0, or $F^*_1<0$, $F^*_2<0$, and Det<0, set the initial estimate of the saturations at point $L_1(S_1^{\beta 2}, S_2^{\beta 2})$;

(j) if $F^*_1<0$, $F^*_2<0$, and Det>0 set the initial estimate of the saturations at point $(S_1^{\beta 3}, S_2^{\beta 3})$; and (k) utilizing the updated Newton's iteration for modeling the three-phase flow of the physical subterranean reservoir system with the reservoir simulator.

* * * * *